United States Patent
Purvis, II et al.

(10) Patent No.: US 12,320,999 B2
(45) Date of Patent: Jun. 3, 2025

(54) HIGH REFRACTIVE INDEX AND HIGHLY BIREFRINGENT SOLID ORGANIC MATERIALS

(71) Applicant: META PLATFORMS TECHNOLOGIES, LLC, Menlo Park, CA (US)

(72) Inventors: Lafe Joseph Purvis, II, Redmond, WA (US); Tingling Rao, Bellevue, WA (US); Tanya Malhotra, Robbinsdale, MN (US); Andrew John Ouderkirk, Kirkland, WA (US); Arman Boromand, Issaquah, WA (US); Kimberly Kay Childress, Duvall, WA (US); Philip Wang, New Haven, CT (US)

(73) Assignee: Meta Platforms Technologies, LLC, Menlo Park, CA (US)

( * ) Notice: Subject to any disclaimer, the term of this patent is extended or adjusted under 35 U.S.C. 154(b) by 613 days.

(21) Appl. No.: 17/678,092

(22) Filed: Feb. 23, 2022

(65) Prior Publication Data

US 2022/0342132 A1 Oct. 27, 2022

Related U.S. Application Data

(60) Provisional application No. 63/179,955, filed on Apr. 26, 2021.

(51) Int. Cl.
*G02B 5/30* (2006.01)
*C30B 7/08* (2006.01)
*C30B 29/54* (2006.01)

(52) U.S. Cl.
CPC ............ *G02B 5/305* (2013.01); *C30B 7/08* (2013.01); *C30B 29/54* (2013.01); *G02B 5/3083* (2013.01)

(58) Field of Classification Search
CPC ........ G02B 5/305; G02B 5/3083; G02B 5/30; G02B 5/3025; G02B 5/3033;
(Continued)

(56) References Cited

U.S. PATENT DOCUMENTS

| 6,608,205 B1 | 8/2003 | Leyderman et al. |
| 2005/0286128 A1* | 12/2005 | Lazarev .................. G02B 1/02 359/489.14 |

(Continued)

FOREIGN PATENT DOCUMENTS

| JP | H05113583 A | 5/1993 |
| JP | 2660576 B2 * | 10/1997 |

OTHER PUBLICATIONS

English translation for JPH05-133583A.*
(Continued)

*Primary Examiner* — Arnel C Lavarias
(74) *Attorney, Agent, or Firm* — Greenberg Traurig, LLP

(57) ABSTRACT

An organic thin film includes an organic solid crystal material and has mutually orthogonal refractive indices, $n_x$, $n_y$, and $n_z$ each having a value at 589 nm of between approximately 1.5 and approximately 2.6, where $n_x \neq n_y \neq n_z$. The organic thin film may be birefringent, and may be configured as a single layer thin film, or plural organic thin films may be stacked to form a multilayer that may be incorporated into an optical element, such as a reflective polarizer.

8 Claims, 18 Drawing Sheets

A

B

(58) Field of Classification Search
CPC ........ G02B 5/3041; G02B 27/28; C30B 7/08; C30B 29/54; C30B 29/64; C30B 29/68
USPC ............ 359/485.03, 483.01, 489.01, 489.07, 359/489.08, 489.11, 489.13; 353/20; 362/19
See application file for complete search history.

(56) References Cited

U.S. PATENT DOCUMENTS

| | | |
|---|---|---|
| 2007/0237918 A1 | 10/2007 | Jonza et al. |
| 2009/0191394 A1 | 7/2009 | Lazarev et al. |
| 2022/0082749 A1* | 3/2022 | Malhotra ............. G02B 5/3041 |

OTHER PUBLICATIONS

International Preliminary Report on Patentability for International Application No. PCT/US2022/026228, mailed Nov. 9, 2023, 8 pages.

International Search Report and Written Opinion for International Application No. PCT/US2022/026228, mailed Sep. 14, 2022, 10 pages.

* cited by examiner

*A*

*B*

Case 18

Case 19

HIGH REFRACTIVE INDEX AND HIGHLY BIREFRINGENT SOLID ORGANIC MATERIALS

CROSS-REFERENCE TO RELATED APPLICATION

This application claims the benefit of priority under 35 U.S.C. § 119(e) of U.S. Provisional Application No. 63/179,955, filed Apr. 26, 2021, the contents of which are incorporated herein by reference in their entirety.

BRIEF DESCRIPTION OF THE DRAWINGS

The accompanying drawings illustrate a number of exemplary embodiments and are a part of the specification. Together with the following description, these drawings demonstrate and explain various principles of the present disclosure.

Figure 1:
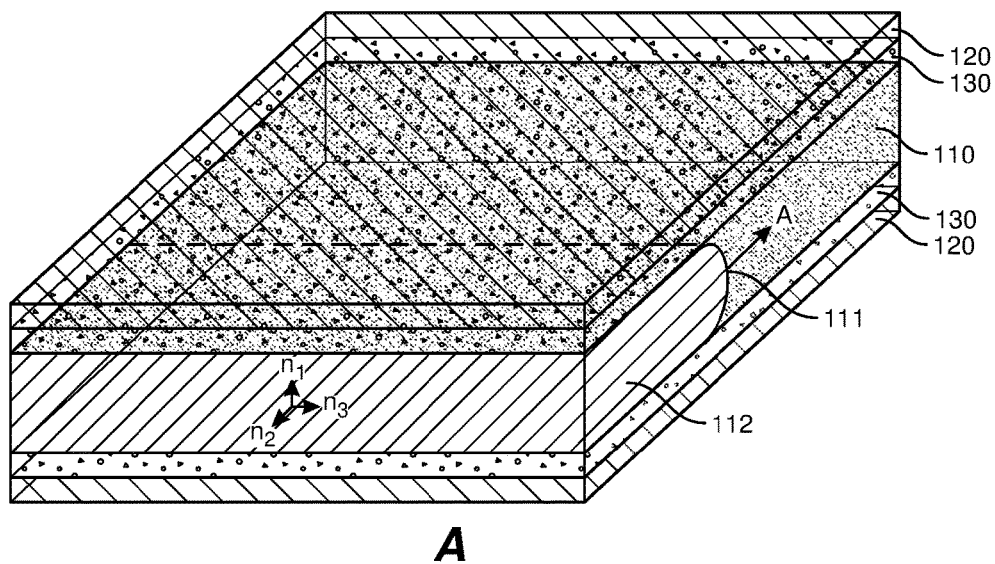
FIG. 1 illustrates example methods for manufacturing (A) a free-standing organic solid crystal thin film and (B) a supported organic solid crystal thin film according to various embodiments.
Figure 1:
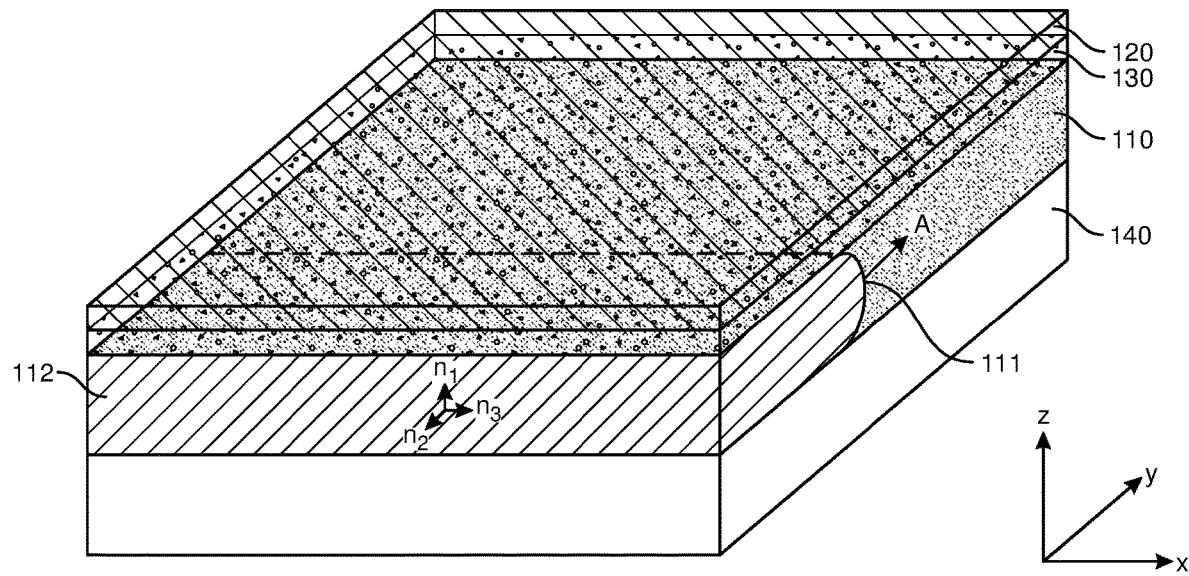

Throughout the drawings, identical reference characters and descriptions indicate similar, but not necessarily identical, elements. While the exemplary embodiments described herein are susceptible to various modifications and alternative forms, specific embodiments have been shown by way of example in the drawings and will be described in detail herein. However, the exemplary embodiments described herein are not intended to be limited to the particular forms disclosed. Rather, the present disclosure covers all modifications, equivalents, and alternatives falling within the scope of the appended claims.

DETAILED DESCRIPTION OF EXEMPLARY EMBODIMENTS

Organic materials may be incorporated into a variety of different optic and electro-optic device architectures, including passive and active optics and electroactive devices. Lightweight and conformable, one or more organic layers may be incorporated into wearable devices such as smart glasses and are attractive candidates for emerging technologies including virtual reality/augmented reality devices where a comfortable, adjustable form factor is desired.

Virtual reality (VR) and augmented reality (AR) eyewear devices or headsets, for instance, may enable users to experience events, such as interactions with people in a computer-generated simulation of a three-dimensional world or viewing data superimposed on a real-world view. By way of example, superimposing information onto a field of view may be achieved through an optical head-mounted display (OHMD) or by using embedded wireless glasses with a transparent heads-up display (HUD) or augmented reality (AR) overlay. VR/AR eyewear devices and headsets may be used for a variety of purposes. For example, governments may use such devices for military training, medical professionals may use such devices to simulate surgery, and engineers may use such devices as design visualization aids. These and other applications may leverage one or more characteristics of thin film organic materials, including the refractive index to manipulate light.

Notwithstanding recent developments, it would be advantageous to provide polymer and other organic solid materials having improved optical properties, including a controllable refractive index and birefringence, optical clarity, and optical transparency. Such materials may be formed into thin films, and a plurality of thin films may be stacked to form a multilayer.

A single layer thin film or a multilayer thin film that includes plural layers of an organic solid crystal material may be incorporated into a variety of optical systems and devices. By way of example, an optical assembly, such as a lens system including a circular reflective polarizer, may include a multilayer organic solid crystal thin film. The multilayer thin film may include a plurality of biaxially oriented organic solid material layers. Each biaxial layer may be characterized by three mutually orthogonal refractive indices $(n_1, n_2, n_3)$ where $n_1 \neq n_2 \neq n_3$. As will be appreciated, in a multilayer architecture, the composition, structure, and/or properties of each organic solid crystal layer may be independently selected.

According to particular embodiments, a multilayer thin film may be incorporated into a circular reflective polarizer for use in display systems to provide high broadband efficiency and high off-axis contrast. By mis-aligning (i.e., rotating) each layer with respect to an adjacent layer, a circular reflective polarizer including a stack of biaxially-oriented OSC thin films may enable higher signal efficiency and greater ghost image suppression than architectures using comparative materials. Organic solid crystal thin films can also be used in various projectors as a brightness enhancement layer.

A circular reflective polarizer may be configured to reflect light of one circular polarization and transmit light having the orthogonal polarization. In pancake VR optics and polarization recycling, for instance, broadband circular reflective polarizers are typically core components where the reflective polarizer quality may impact the display viewing experience of a user or the recycling efficiency of the device.

In comparative systems, a circular reflective polarizer may include a linear reflective polarizer and quarter waveplate, where the linear reflective polarizer is often made using one or more polymer materials, such as PEN. A circular reflective polarizer can also be made using cholesteric materials, such as a cholesteric liquid crystal (CLC). For virtual reality and augmented reality systems, however, such comparative approaches may not provide a desired combination of broadband efficiency (e.g., as a function of gaze angle) and ghost image suppression.

Comparative materials that may be used for optoelectronic systems and devices include inorganic compositions, liquid crystals, and polymer materials. These classes of materials are rapidly approaching their application limits, however, due to issues such as limited refractive index, limited birefringence, weight, and the lack of tunability, which may adversely impact manufacturability and performance including angular bandwidth, resolution, transparency, clarity, etc.

As used herein, a material or element that is "transparent" or "optically transparent" may, for a given thickness, have a transmissivity within the visible light spectrum of at least approximately 80%, e.g., approximately 80, 90, 95, 97, 98, 99, or 99.5%, including ranges between any of the foregoing values, and less than approximately 5% bulk haze, e.g., approximately 0.1, 0.2, 0.4, 1, 2, or 4% bulk haze, including ranges between any of the foregoing values. Transparent materials will typically exhibit very low optical absorption and minimal optical scattering.

As used herein, the terms "haze" and "clarity" may refer to an optical phenomenon associated with the transmission of light through a material, and may be attributed, for example, to the refraction of light within the material, e.g., due to secondary phases or porosity and/or the reflection of light from one or more surfaces of the material. As will be appreciated by those skilled in the art, haze may be associated with an amount of light that is subject to wide angle scattering (i.e., at an angle greater than 2.5° from normal) and a corresponding loss of transmissive contrast, whereas clarity may relate to an amount of light that is subject to narrow angle scattering (i.e., at an angle less than 2.5° from normal) and an attendant loss of optical sharpness or "see through quality."

According to various embodiments, an organic solid crystal (OSC) thin film may include an organic solid crystal material where the organic solid crystal thin film has mutually orthogonal refractive indices ($n_x$, $n_y$, $n_z$), such that $n_x$, $n_y$, and $n_z$ each have a value at 589 nm of between approximately 1.5 and approximately 2.6, and $n_x \neq n_y \neq n_z$. In accordance with particular embodiments, an organic solid crystal (OSC) thin film may be characterized by a through-thickness refractive index ($n_z$) that is at least approximately 1.5 across the visible spectrum and an out-of-plane birefringence ($\Delta n_{xz}$ and/or $\Delta n_{yz}$) of at least approximately 0.2.

As will be appreciated, and in accordance with some embodiments, the mutually orthogonal designations $n_x$, $n_y$, and $n_z$ may be independent of the crystallographic axes for a given crystal, and may be associated, for example, with an arbitrary set of axes, such as the orientation of an apparatus used to measure the refractive index.

One or more source materials may be used to form an organic solid crystal thin film, including a multilayer thin film. Example organic materials may include various classes of crystallizable organic semiconductors. In accordance with various embodiments, organic semiconductors may include small molecules, macromolecules, liquid crystals, organometallic compounds, oligomers, and polymers. Organic semiconductors may include p-type, n-type, or ambipolar polycyclic aromatic hydrocarbons, such as anthracene, phenanthrene, carbon 60, pyrene, corannulene, fluorene, biphenyl, terphenyl, etc.

Example compounds may include cyclic, linear and/or branched structures, which may be saturated or unsaturated, and may additionally include heteroatoms and/or saturated or unsaturated heterocycles, such as furan, pyrrole, thiophene, pyridine, pyrimidine, piperidine, and the like. Heteroatoms may include fluorine, chlorine, nitrogen, oxygen, sulfur, phosphorus, as well as various metals.

The disclosed organic solid crystal (OSC) materials may include various classes of organic semiconductors. Organic small molecule optoelectronics may exhibit improved device performance as a result of better control of light propagation and electron mobility. Example devices that may integrate the high refractive index and highly birefringent solid organic materials disclosed herein include OPVs, OFETs, e.g. photodiodes, and OLEDs.

Structurally, the disclosed organic materials, as well as the thin films derived therefrom, may be single crystal, polycrystalline, or glassy. Organic solid crystals may include closely packed structures (e.g., organic molecules) that exhibit desirable optical properties such as a high and tunable refractive index, and high birefringence. Anisotropic organic solid materials may include a preferred packing of molecules or a preferred orientation or alignment of molecules.

Such materials may provide functionalities, including phase modulation, beam steering, wave-front shaping and correction, optical communication, optical computation, holography, etc. Due to their optical and mechanical properties, organic solid crystals may enable high-performance devices, and may be incorporated into passive or active optics, including AR/VR headsets, and may replace comparative material systems such as polymers, inorganic materials, and liquid crystals. In certain aspects, organic solid crystals may have optical properties that rival those of inorganic materials while exhibiting the processability and electrical response of liquid crystals.

Due to the relatively low melting temperature of many suitable source molecules, organic solid crystals may be molded to form a desired structure. Molding processes may enable complex architectures and may be more economical than the cutting, grinding, and polishing of bulk crystals.

In addition, as disclosed further herein, a chemical additive may be integrated with a molding process to improve the surface roughness and hence the optical performance of a molded organic solid crystal in situ. The chemical additive may include a liquid non-volatile medium, such as an oil. In some embodiments, a single crystal or polycrystalline basic shape such as a sheet or cube may be partially or fully melted into a desired form and then controllably cooled to form a single crystal having a new shape. Suitable feedstock for molding solid organic semiconductor materials may include neat organic compositions, melts, solutions, or suspensions of one or more suitable organic molecules.

High refractive index and highly birefringent organic semiconductor materials may be manufactured as a free-standing thin film or as a thin film deposited onto a substrate. In some embodiments, an epitaxial or non-epitaxial growth process may be used to form an organic solid crystal (OSC) layer over a suitable substrate or mold. A seed crystal for encouraging crystal nucleation and an anti-nucleation layer configured to locally inhibit nucleation may collectively promote the formation of a limited number of crystal nuclei within one or more specified location(s), which may in turn encourage the formation of larger organic solid crystals. In some embodiments, a nucleation-promoting layer or seed crystal may itself be configured as a thin film.

A process of molding an optically anisotropic crystalline or partially crystalline thin film, for example, may include operational control of the thermodynamics and kinetics of nucleation and crystal growth. In certain embodiments, a temperature during molding proximate to a nucleation region of a mold may be less than a melting onset temperature ($T_m$) of a molding composition, while the temperature remote from the nucleation region may be greater than the melting onset temperature. Such a temperature gradient paradigm may be obtained through a spatially applied thermal gradient, optionally in conjunction with a selective melting process (e.g., laser, soldering iron, etc.) to remove excess nuclei, leaving few nuclei (e.g., a single nucleus) for crystal growth.

A suitable mold for molding an organic solid crystal thin film may be formed from a material having a softening temperature or a glass transition temperature ($T_g$) greater than the melting onset temperature ($T_m$) of the molding composition. The mold may include any suitable material, e.g., silicon, silicon dioxide, fused silica, quartz, glass, nickel, silicone, siloxanes, perfluoropolyethers, polytetrafluoroethylenes, perfluoroalkoxy alkanes, polyimide, polyethylene naphthalate, polyvinylidene fluoride, polyphenylene sulfide, and the like.

Example nucleation-promoting or seed layer materials may include one or more metallic or inorganic elements or compounds, such as Pt, Ag, Au, Al, Pb, indium tin oxide, $SiO_2$, and the like. Further example nucleation-promoting or seed layer materials may include organic compounds, such as a polyimide, polyamide, polyurethane, polyurea, polythiolurethane, polyethylene, polysulfonate, polyolefin, as well as mixtures and combinations thereof. In some examples, a nucleation-promoting material may be configured as a textured or aligned layer, such as a rubbed polyimide or photoalignment layer, which may be configured to induce directionality or a preferred orientation to an over-formed organic solid crystal thin film.

An example method for manufacturing an organic solid crystal thin film includes providing a mold, forming a layer of a nucleation-promoting material over at least a portion of a surface of the mold, and depositing a layer of molten feedstock over the surface of the mold and in contact with the layer of the nucleation-promoting material, while maintaining a temperature gradient across the layer of the molten feedstock.

An anti-nucleation layer may include a dielectric material. In further embodiments, an anti-nucleation layer may include an amorphous material. In example processes, crystal nucleation may occur independent of a substrate or mold.

In some embodiments, a surface treatment or a release layer disposed over the substrate or mold may be used to control nucleation and growth of the organic solid crystal (OSC) and later promote separation and harvesting of a bulk crystal or thin film. For instance, a coating having a solubility parameter mismatch with the deposition chemistry may be applied to the substrate (e.g., locally or globally) to suppress interaction between the substrate and the crystallizing layer during the deposition process.

Example surface treatment coatings may include oleophobic coatings or hydrophobic coatings. A thin layer, e.g., monolayer or bilayer, of an oleophobic material or a hydrophobic material may be used to condition the substrate or mold prior to an epitaxial process. The coating material may be selected based on the substrate and/or the organic crystalline material. Further example surface treatment coating materials include siloxanes, fluorosiloxanes, phenyl siloxanes, fluorinated coatings, polyvinyl alcohol, and other OH bearing coatings, acrylics, polyurethanes, polyesters, polyimides, and the like.

In some embodiments, a release agent may be applied to an internal surface of the mold and/or combined with the molding composition. A surface treatment of an inner surface of the mold may include the chemical bonding or physical adsorption of small molecules, or polymers/oligomers having linear, branched, dendritic, or ringed structures, that may be functionalized or terminated, for example, with fluorinated groups, silicones, or hydrocarbon groups.

A buffer layer may be formed over the deposition surface of a substrate or mold. A buffer layer may include a small molecule that may be similar to or even equivalent to the small molecule forming the organic solid crystal, e.g., an anthracene single crystal. A buffer layer may be used to tune one or more properties of the deposition/growth surface of the substrate or mold, including surface energy, wettability, crystalline or molecular orientation, etc.

A further example method for manufacturing an organic solid crystal thin film includes forming a layer of a molecular feedstock over a surface of a mold, the molecular feedstock including crystallizable organic molecules, forming a selected number of crystal nuclei from the organic molecules within a nucleation region of the molecular feedstock layer, and growing the selected number of crystal nuclei to form an organic solid crystal thin film. In some embodiments, the selected number of crystal nuclei may be one. Crystal growth may be controlled using an isothermal process, slow cooling, and zone annealing.

Further example deposition methods for forming organic solid crystals include vapor phase growth, solid state growth, melt-based growth, solution growth, etc., optionally in conjunction with a suitable substrate. A substrate may be organic or inorganic. Additional deposition processes and related methods may include chemical vapor deposition, physical vapor deposition, spin-coating, blade-coating, inkjet printing, thermal annealing, zone annealing, etching, stamping, role-to-role processing, etc. According to some embodiments, solid-, liquid-, or gas-phase deposition processes may include epitaxial processes.

As used herein, the terms "epitaxy," "epitaxial" and/or "epitaxial growth and/or deposition" refer to the nucleation and growth of an organic solid crystal on a deposition surface where the organic solid crystal layer being grown assumes the same crystalline habit as the material of the deposition surface. For example, in an epitaxial growth process, chemical reactants may be controlled, and the system parameters may be set so that depositing atoms or molecules alight on the deposition surface and remain sufficiently mobile via surface diffusion to orient themselves according to the crystalline orientation of the atoms or molecules of the deposition surface. An epitaxial process may be homogeneous or heterogeneous.

During an example method, to promote nucleation and crystal growth, a selected temperature and temperature gradient may be applied to a crystallization front of the nascent thin film. For instance, the temperature and temperature gradient proximate to the crystallization front may be determined based on the selected feedstock, including its melting temperature, thermal stability, and rheological attributes.

The substrate or mold may include a surface that may be configured to provide a desired shape to the molded organic solid crystal thin film. For example, the substrate or mold surface may be planar, concave, or convex, and may include a three-dimensional architecture, such as surface relief gratings, or a curvature configured to form microlenses, microprisms, or prismatic lenses. That is, according to some embodiments, a substrate or mold geometry may be transferred and incorporated into a surface of an over-formed organic solid crystal thin film.

The deposition surface of a substrate or mold may include a functional layer that is adapted to be transferred to the organic solid crystal after formation of the organic solid crystal and its separation from the substrate or mold. Functional layers may include an interference coating, an AR coating, a reflectivity enhancing coating, a bandpass coating, a band-block coating, blanket or patterned electrodes, etc. By way of example, an electrode may include any suitably electrically conductive material such as a metal, a transparent conductive oxide (TCO) (e.g., indium tin oxide or indium gallium zinc oxide), or a metal mesh or nanowire matrix (e.g., including metal nanowires or carbon nanotubes).

For the sake of convenience, the terms "substrate" and "mold" may be used interchangeably herein unless the context indicates otherwise. In some embodiments, a non-volatile medium material may be disposed between the mold surface and the organic precursor and may be adapted to decrease the surface roughness of the molded organic solid crystal and promote its release from the mold while locally promoting or inhibiting nucleation of a crystalline phase.

According to some embodiments, organic solid crystal thin films may be formed by growth of large area crystals, which may be produced by methods such as solution growth or growth from a melt, and which may be cut or diced to the desired thickness with the crystal axes, and hence the different crystal refractive indexes, oriented along desired device directions. A diced crystalline thin film (e.g., single crystal thin film) may be laminated onto a substrate to form an OSC thin film for a selected device.

In accordance with various embodiments, the optical and electrooptical properties of an organic solid crystal may be tuned using doping and related techniques. Doping may influence the polarizability of an organic solid crystal thin film, for example. The introduction of dopants, i.e., impurities, into an organic solid crystal, may influence, for example, the highest occupied molecular orbital (HOMO) and lowest unoccupied molecular orbital (LUMO) bands and hence the band gap of the OSC material, its induced dipole moment, and/or its molecular/crystal polarizability.

Doping may be performed in situ, i.e., during epitaxial growth, or following epitaxial growth, for example, using ion implantation or plasma doping. In exemplary embodiments, doping may be used to modify the electronic structure of an organic solid crystal without damaging molecular packing or the crystal structure itself. In this vein, a post-implantation annealing step may be used to heal crystal defects introduced during ion implantation. Annealing may include rapid thermal annealing or pulsed annealing, for example.

Doping changes the electron and hole carrier concentrations of a host material at thermal equilibrium. A doped organic solid crystal may be p-type or n-type. As used herein, "p-type" refers to the addition of impurities to an organic solid crystal that create a deficiency of valence electrons, whereas "n-type" refers to the addition of impurities that contribute free electrons to an organic solid crystal. Without wishing to be bound by theory, doping may influence "π-stacking" and "π-π interactions" within an organic solid crystal.

Example dopants include Lewis acids (electron acceptors) and Lewis bases (electron donors). Particular examples include charge-neutral and ionic species, e.g., Brønsted acids and Brønsted bases, which in addition to the aforementioned processes may be incorporated into an organic solid crystal by solution growth or co-deposition from the vapor phase. In particular embodiments, a dopant may include an organic molecule, an organic ion, an inorganic molecule, or an inorganic ion. A doping profile may be homogeneous or localized to a particular region (e.g., depth or area) of an organic solid crystal thin film. In accordance with various embodiments, advantages of the disclosed methods may include improved processability and lower cost relative to alternate methods.

Following deposition, an OSC thin film may be diced and polished to achieve a desired form factor and surface quality. Dicing may include diamond turning, for example, although other cutting methods may be used. Polishing may include chemical mechanical polishing. In some embodiments, a chemical or mechanical surface treatment may be used to create structures on a surface of an OSC thin film. Example surface treatment methods include diamond turning and photolithography/etch processes. In some embodiments, a cover plate or substrate with reciprocal structures may be used to fabricate surface structures of an OSC thin film, e.g., during zone annealing.

An organic solid crystal thin film may include an organic crystalline phase. The organic crystalline phase may be single crystal or polycrystalline. In some embodiments, the organic crystalline phase may include amorphous regions. In some embodiments, the organic crystalline phase may be substantially crystalline. A crystalline phase may constitute at least approximately 80% of an organic solid crystal thin film, e.g., at least approximately 80%, at least approximately 85%, at least approximately 90%, or at least approximately 95%, including ranges between any of the foregoing values.

The organic crystalline phase may be characterized by a refractive index along at least one principal axis of at least approximately 1.5 at 589 nm, and may be optically isotropic or anisotropic. By way of example, the refractive index of the organic crystalline phase at 589 nm and along at least one principal axis (e.g., one or both in-plane principal axes of an organic solid crystal thin film) may be at least approximately 1.5, at least approximately 1.6, at least approximately 1.7, at least approximately 1.8, at least approximately 1.9, at least approximately 2.0, at least approximately 2.1, at least approximately 2.2, at least approximately 2.3, at least approximately 2.4, at least approximately 2.5, or at least approximately 2.6, including ranges between any of the foregoing values.

In some embodiments, the organic crystalline phase may be isotropic ($n_1=n_2=n_3$) or anisotropic ($n_1 \neq n_2 \neq n_3$ or $n_1 \neq n_2 = n_3$ or $n_1 = n_2 \neq n_3$) and thus may be characterized by a birefringence ($\Delta n$) of at least approximately 0.2, e.g., at least approximately 0.2, at least approximately 0.3, at least approximately 0.4, or at least approximately 0.5, including ranges between any of the foregoing values. In some embodiments, a birefringent organic crystalline phase may be characterized by a birefringence of less than approximately 0.2, e.g., less than approximately 0.2, less than approximately 0.1, less than approximately 0.05, less than approximately 0.02, less than approximately 0.01, less than approximately 0.005, less than approximately 0.002, or less than approximately 0.001, including ranges between any of the foregoing values. In particular embodiments, and in conjunction with an instrument frame of reference, an OSC thin film may be characterized by an in-plane refractive index of at least approximately 1.5 across the visible spectrum, and an in-plane birefringence of at least approximately 0.2.

Three axis ellipsometry data for example isotropic or anisotropic organic molecules are shown in Table 1. The data include predicted and measured refractive index values and birefringence values for 1,2,3-trichlorobenzene (1,2,3-TCB), 1,2-diphenylethyne (1,2-DPE), phenazine, terphenyl, 1,2-bis(4-(methylthio)phenyl)ethyne (1,2-MTPE), and anthracene. A still further example organic molecule includes tetraphenylmethane. The apparatus (e.g., ellipsometer) used to measure refractive index provides the frame of reference for the values $n_x$, $n_y$, and $n_z$. Shown are larger than anticipated refractive index values and birefringence compared to calculated values based on the HOMO-LUMO gap for each organic material composition.

TABLE 1

Index and Birefringence Data for Example Organic Semiconductors

| Organic Material | Predicted Index | Measured Index (589 nm) | | | Birefringence | | |
|---|---|---|---|---|---|---|---|
| | | $n_x$ | $n_y$ | $n_z$ | $\Delta n(xy)$ | $\Delta n(xz)$ | $\Delta n(yz)$ |
| 1,2,3-TCB | 1.567 | 1.67 | 1.76 | 1.85 | 0.09 | 0.18 | 0.09 |
| 1,2-DPE | 1.623 | 1.62 | 1.83 | 1.63 | 0.21 | 0.01 | 0.20 |
| phenazine | 1.74 | 1.76 | 1.84 | 1.97 | 0.08 | 0.21 | 0.13 |
| terphenyl | 1.602 | 1.63 | 1.53 | 1.99 | 0.1 | 0.36 | 0.46 |
| 1,2-MTPE | n/a | 1.51 | 1.61 | 1.98 | 0.1 | 0.47 | 0.37 |
| anthracene | 1.715 | 1.75 | 1.5 | 2.07 | 0.25 | 0.32 | 0.57 |

According to some embodiments, an organic solid crystal thin film may be characterized by its refractive index and/or birefringence. In some examples, the birefringence of an organic solid crystal thin film may be represented as $\Delta n_{xy} < \Delta n_{xz} < \Delta n_{yz}$ or $\Delta n_{xy} < \Delta n_{yz} < \Delta n_{xz}$. In some examples, the birefringence of an organic solid crystal thin film may be represented as $2\Delta n_{xy} < \Delta n_{xz}$ or $2\Delta n_{xy} < \Delta n_{yz}$. In still further examples, the birefringence of an organic solid crystal thin film may be represented as $3\Delta n_{xy} < \Delta n_{xz}$ and $3\Delta n_{xy} < \Delta n_{yz}$.

In some example organic solid crystal thin films, $\Delta n_{xy} = \Delta n_{xz} < \Delta n_{yz}$ or $\Delta n_{xy} = \Delta n_{yz} < \Delta n_{xz}$. Further example organic solid crystal thin films may be characterized by $\Delta n_{xz} < \Delta n_{xy} = \Delta n_{yz}$ or $\Delta n_{yz} < \Delta n_{xy} = \Delta n_{xz}$. Still further organic solid crystal thin films may be characterized by $10\Delta n_{xz} < \Delta n_{xy} = \Delta n_{yz}$ or $10\Delta n_{yz} < \Delta n_{xy} = \Delta n_{xz}$.

In some embodiments, the organic crystalline phase may define a surface of a thin film having a surface roughness ($R_a$) of less than approximately 10 micrometers over an area of at least approximately 1 cm². In some embodiments, at least one surface of the organic solid crystal thin film may have a surface roughness ($R_a$) of less than approximately 10000 nm, less than approximately 5000 nm, less than approximately 2000 nm, less than approximately 1000 nm, less than approximately 500 nm, less than approximately 200 nm, less than approximately 100 nm, less than approximately 50 nm, less than approximately 20 nm, less than approximately 10 nm, less than approximately 5 nm, or less than approximately 2 nm, including ranges between any of the foregoing values.

An organic solid crystal thin film may be configured in a variety of shapes and/or form factors. An organic solid crystal thin film may include a surface that is planar, convex, or concave. In some embodiments, the surface may include a three-dimensional architecture, such as a periodic surface relief grating. In further embodiments, a thin film may be configured as a microlens or a prismatic lens. For instance, polarization optics may include a microlens that selectively focuses one polarization of light over another.

In some embodiments, a structured surface may be formed in situ, i.e., during crystal growth of the organic solid crystal. In further embodiments, a structured surface may be formed after crystal growth, e.g., using additive or subtractive processing, such as photolithography and etching. A thin film or bulk crystal of an organic semiconductor may be free-standing or disposed over a substrate. A substrate, if used, may be rigid or deformable. The nucleation and growth kinetics and choice of chemistry may be selected to produce a solid organic crystal thin film having areal (lateral) dimensions of at least approximately 1 cm.

According to some embodiments, the disclosed organic solid crystals may have an actively tunable refractive index and birefringence. Applicants have shown that through the application of an electric current and/or voltage, the refractive index of various organic compositions can be tuned to a commercially-relevant degree in a highly controlled fashion.

Methods of manufacturing organic solid crystals may enable control of their surface roughness independent of surface features (e.g., gratings, etc.) and may include the formation of an organic article therefrom. According to various embodiments, an organic solid crystal thin film may be integrated into an optical component or device, such as an OFET, OPV, OLED, etc., and may be incorporated into an optical element such as a waveguide, Fresnel lens (e.g., a cylindrical Fresnel lens or a spherical Fresnel lens), grating, photonic integrated circuit, birefringent compensation layer, reflective polarizer, index matching layer (LED/OLED), and the like. In certain embodiments, grating architectures may be tunable along one, two, or three principal axes. Optical elements may include a single layer or a multilayer OSC architecture.

As will be appreciated, one or more characteristics of organic solid crystals may be specifically tailored for a particular application. For many optical applications, for instance, it may be advantageous to control crystallite size, surface roughness, mechanical strength and toughness, and the orientation of crystallites and/or molecules within an organic solid crystal thin film and hence control the magnitude of both the refractive index and the birefringence along principal axes.

In accordance with various embodiments, high refractive index and highly birefringent solid organic materials may be incorporated into passive and active optoelectronic elements and can be tuned to desired properties, e.g., via independent control of refractive indices along principal axes. Anisotropic, organic small molecules may be used to form solid organic materials having higher than anticipated refractive indices and birefringence that individually or collectively may be used to overcome current materials limitations and enable the production of next generation optoelectronic devices.

In certain embodiments, an optical element that includes a high refractive index and highly birefringent solid organic material may be located within the transparent aperture of an optical device such as a lens, although the present disclosure is not particularly limited and may be applied in a broader context. By way of example, an optical element may be incorporated into a tunable lens, a light source, a light projector, an optical waveguide, etc.

Optical elements may include a single or multilayer stack of one or more high refractive index and highly birefringent organic materials. Single layers and multilayers may be planar or non-planar, and may include surface features such as grating structures, which may be characterized by a substantially constant or spatially-variable form factor.

In some embodiments, high refractive index and highly birefringent solid organic materials may impact one or more attributes of passive optical elements and related devices including device efficiency, angular and diffraction bandwidth, artifact generation, device weight, etc. Passive optics may include, but are not limited to, waveguides, projectors and projection optics, ophthalmic high index lenses, eye-tracking components, gradient-index optics, Fresnel lenses, Pancharatnam-Berry phase (PBP) lenses, refractive/diffractive lenses, polarization selective gratings, Fresnel lenses, microlenses, geometric lenses, PBP lenses, and reflective polarizers.

The active modulation of refractive index may improve the performance of photonic systems and devices, including active optical waveguides, resonators, lasers, optical modulators, etc. Further example active optics include projectors and projection optics, ophthalmic high index lenses, eye-tracking components, gradient-index optics, Fresnel lenses, Pancharatnam-Berry phase (PBP) lenses, microlenses, pupil steering elements, Faraday rotators, switchable index modules, optical computing, fiber optics, rewritable optical data storage, all-optical logic gates, multi-wavelength optical data processing, optical transistors, etc.

In some embodiments, the refractive index of a high refractive index and highly birefringent material structure or element (e.g., thin film) may be increased or decreased relative to an as-formed value. For example, one or more mechanical or electrical processing techniques (e.g., stretching, bending, charge induction, piezoelectric effect, etc.) may be used to tune the refractive index.

High refractive index and highly birefringent solid organic materials may impact one or more attributes of active optical elements and related devices including device efficiency, angular and diffraction bandwidth, artifact generation, device weight, and modulation of the refractive index while an element is active.

Features from any of the embodiments described herein may be used in combination with one another in accordance with the general principles described herein. These and other embodiments, features, and advantages will be more fully understood upon reading the following detailed description in conjunction with the accompanying drawings and claims.

The following will provide, with reference to FIGS. 1-14, detailed descriptions of high refractive index and highly birefringent solid organic materials as well as optical systems and devices that include such materials. The discussion associated with FIGS. 1-3 includes a description of example manufacturing methods for forming organic solid crystals. The discussion associated with FIGS. 4-11 relates to the structure and properties of example organic solid crystal materials, including three axis ellipsometry data for exemplary anisotropic small organic molecules. FIG. 12 is a schematic diagram illustrating various configurations of example electrooptic devices and systems that include a high refractive index and highly birefringent solid organic material. The discussion associated with FIGS. 13 and 14 relates to exemplary virtual reality and augmented reality devices that may include one or more organic solid crystal thin films as disclosed herein.

Turning to FIG. 1, shown schematically are example manufacturing architectures that may be implemented in accordance with certain methods of forming an organic solid crystal thin film. In some embodiments, a layer of a crystallizable organic precursor 110 may be deposited over a surface of a mold 120 or between mold surfaces and processed to form an organic solid crystal thin film 112. The crystallizable organic precursor may include one or more crystallizable organic molecules.

Referring to FIG. 1A, shown at an intermediate stage of fabrication, the organic precursor layer 110 may be disposed between upper and lower mold bodies 120, which may be respectively coated with upper and lower layers of a non-volatile medium material 130. The non-volatile medium material layer 130 may include an anti-nucleation layer. Following processing to induce nucleation and growth of the organic solid crystal, the resulting organic solid crystal thin film 112 may be removed from the mold 120. Exemplary processing steps may include zone annealing. The organic solid crystal thin film 112 may be birefringent (e.g., $n_1 \neq n_2 \neq n_3$) and may be characterized by a high refractive index (e.g., $n_2 > 1.5$ and/or $n_3 > 1.5$).

Figure 2:
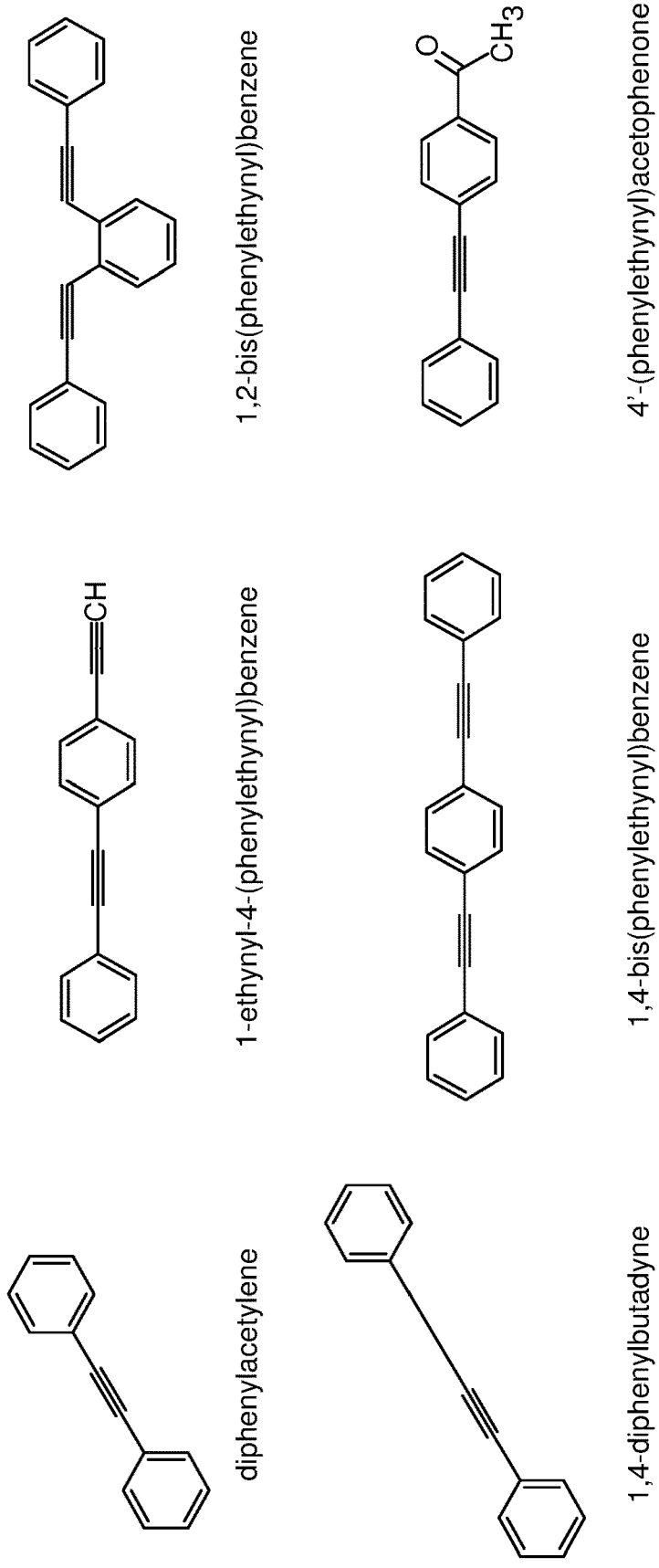
FIG. 2 shows example crystallizable organic molecules suitable for forming organic solid crystal thin films according to certain embodiments.
Figure 2:
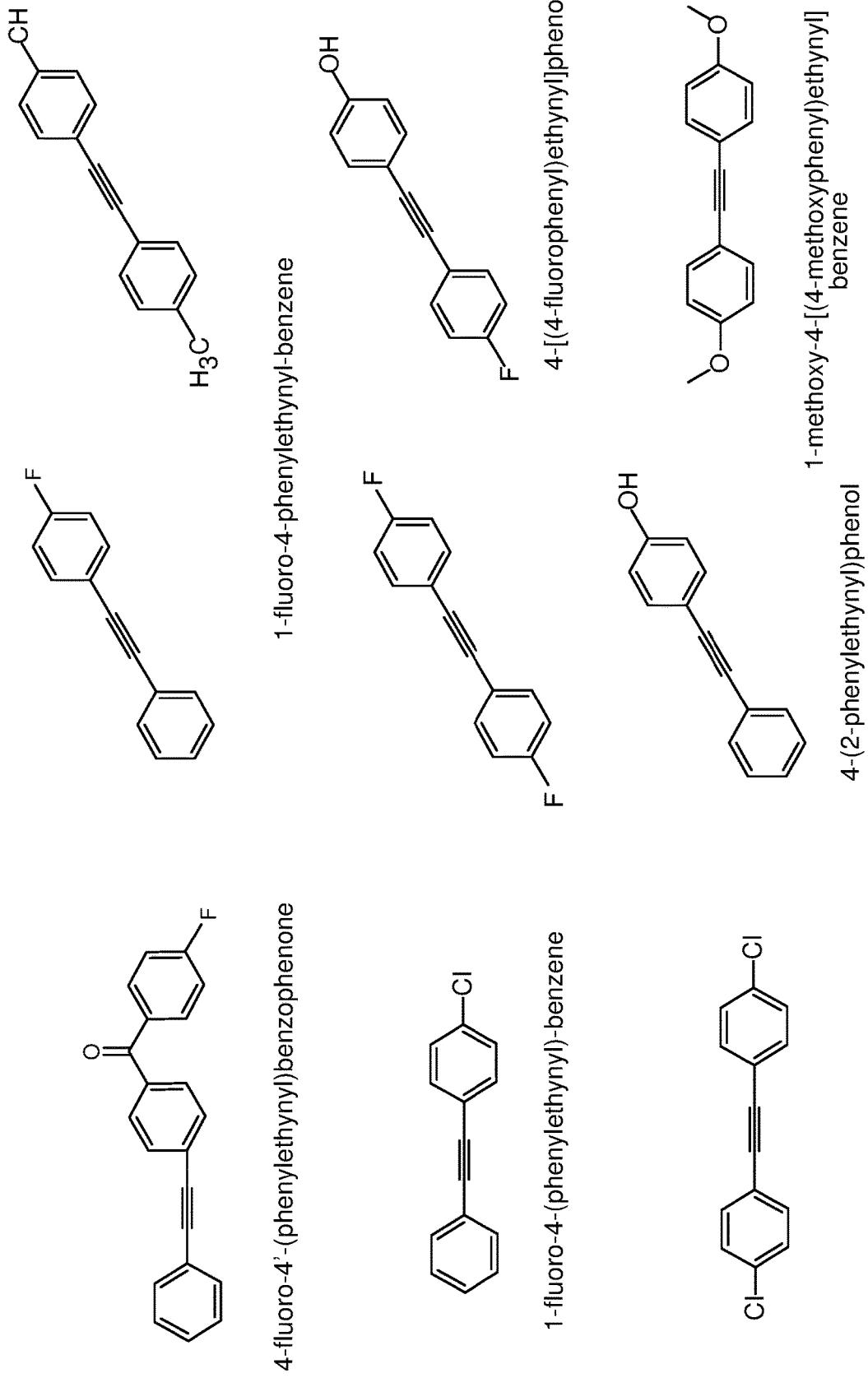
Figure 2:
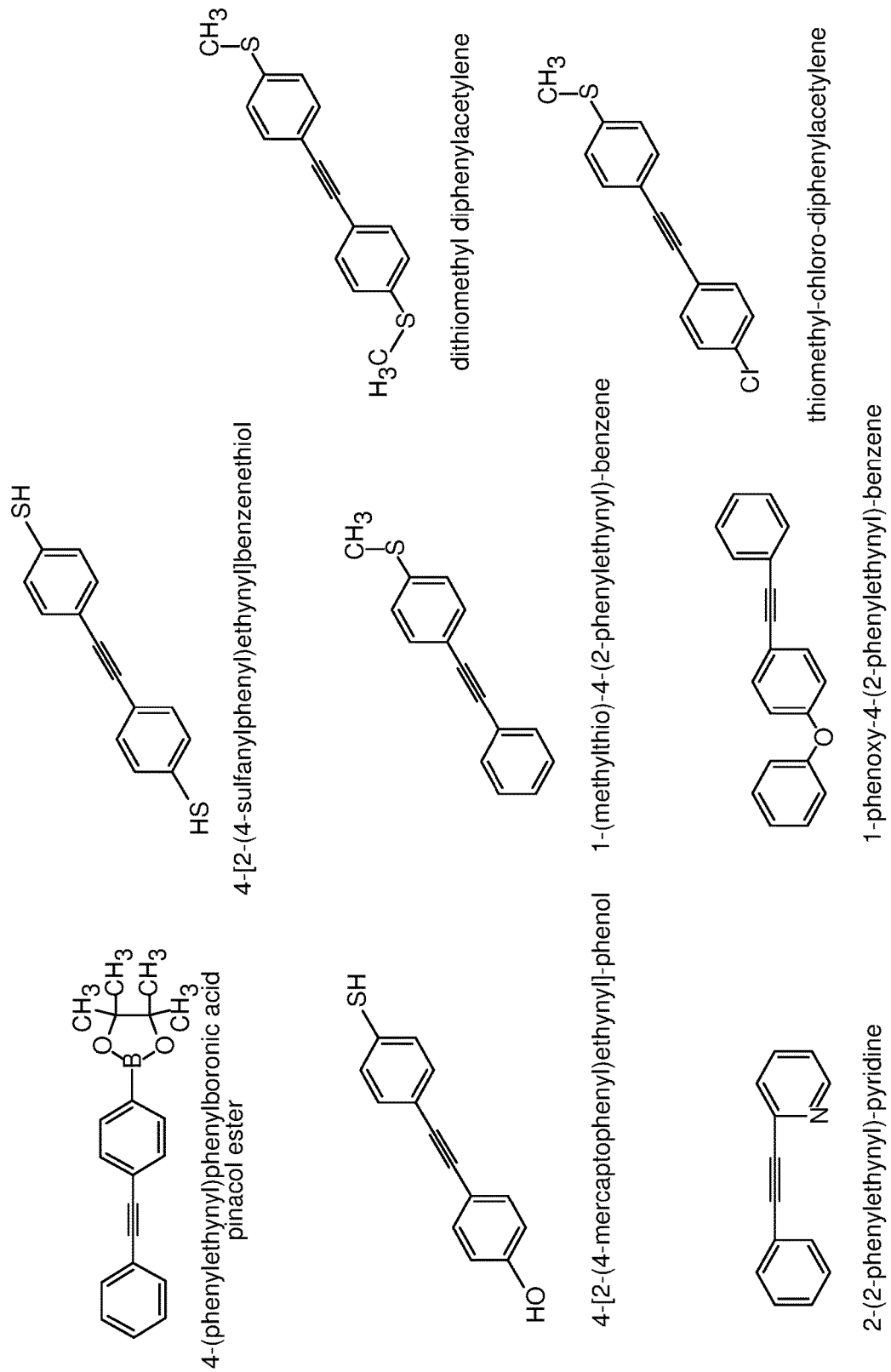

Referring to FIG. 1B, shown is a further manufacturing architecture for forming a supported organic solid crystal thin film. In the architecture of FIG. 1B, at an intermediate stage of fabrication, a crystallizable organic precursor layer 110 may be disposed over a substrate 140. An upper mold body 120 may overlie the organic precursor layer 110, and a non-volatile medium material layer 130 may be located between the mold 120 and the organic precursor layer 110. The layer of non-volatile medium material 130 may directly overlie the organic precursor layer 110 and may be configured to control the surface roughness of an upper surface of the organic solid crystal thin film 112 during crystal growth. In accordance with some embodiments, in FIG. 1A and FIG. 1B, the direction of movement of a crystallization front 111 during crystal growth is denoted with an arrow A. Example small molecules (e.g., organic precursors) that may be used to form an organic solid crystal thin film such as organic solid crystal thin film 112 are illustrated in FIG. 2.

Figure 3:
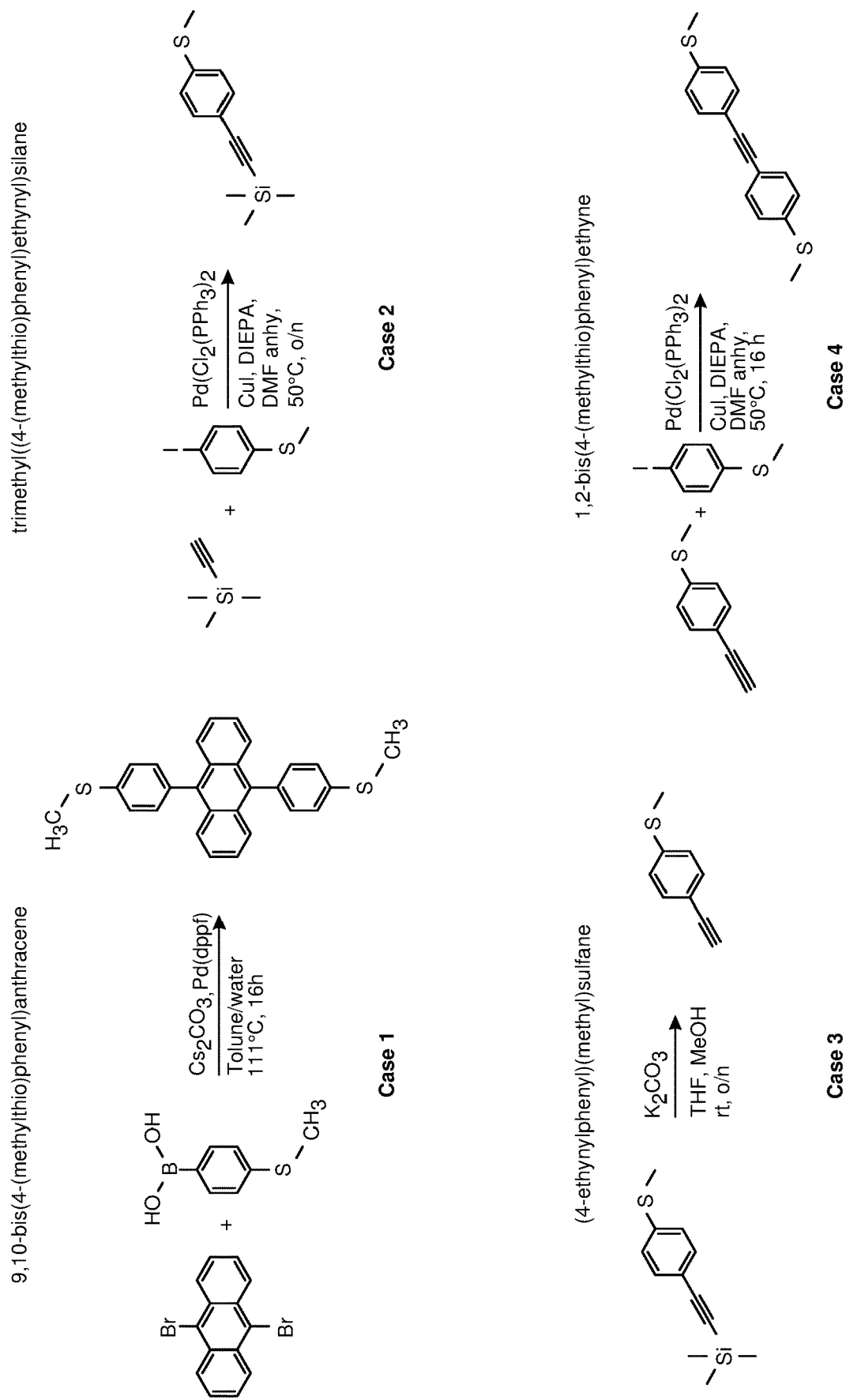
FIG. 3 shows various synthesis routes for preparing crystallizable organic molecules according to some embodiments.
Figure 3:
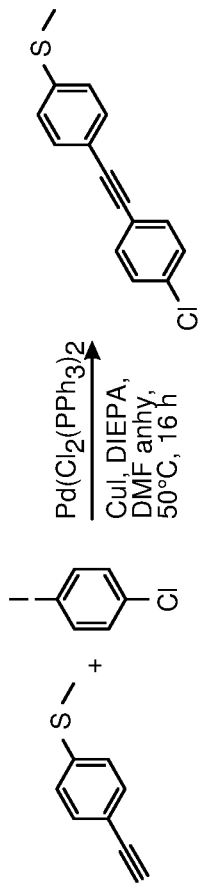
Figure 3:
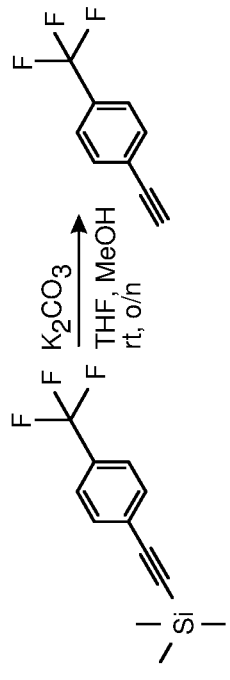
Figure 3:
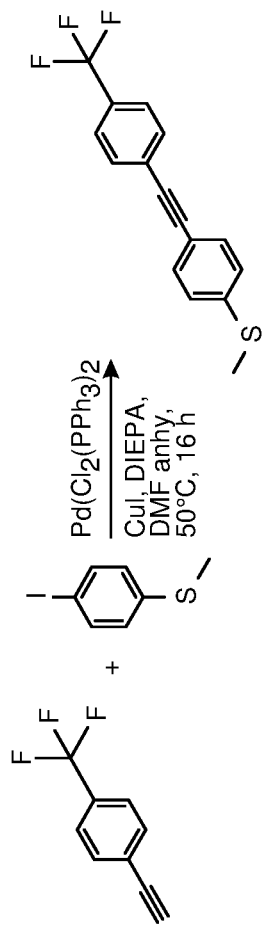
Figure 3:
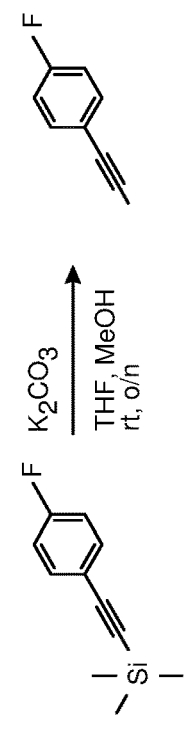
Figure 3:
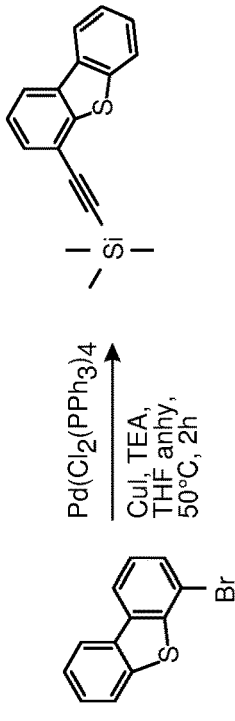
Figure 3:
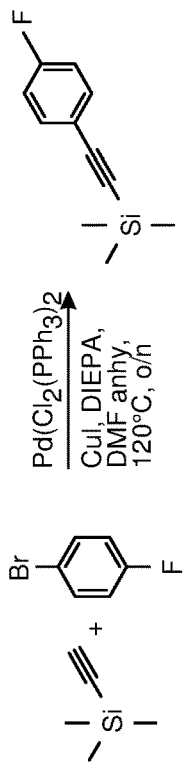
Figure 3:
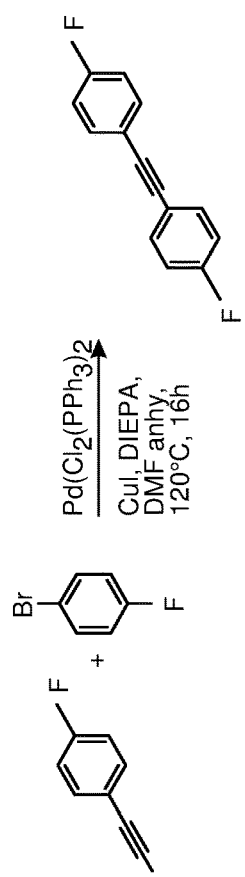
Figure 3:
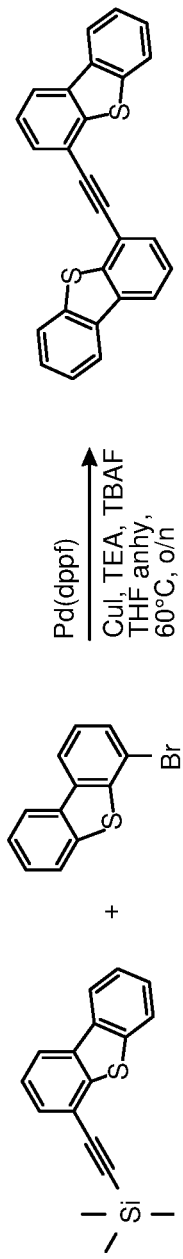
Figure 3:
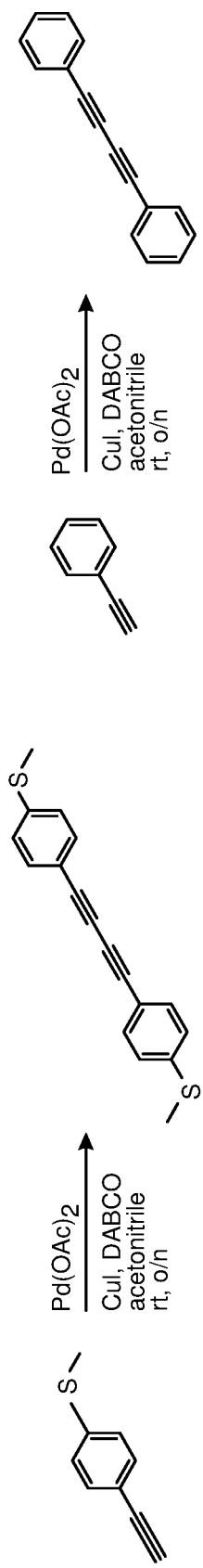
Figure 3:
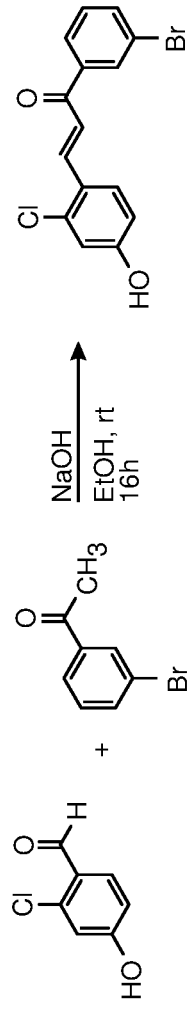
Figure 3:
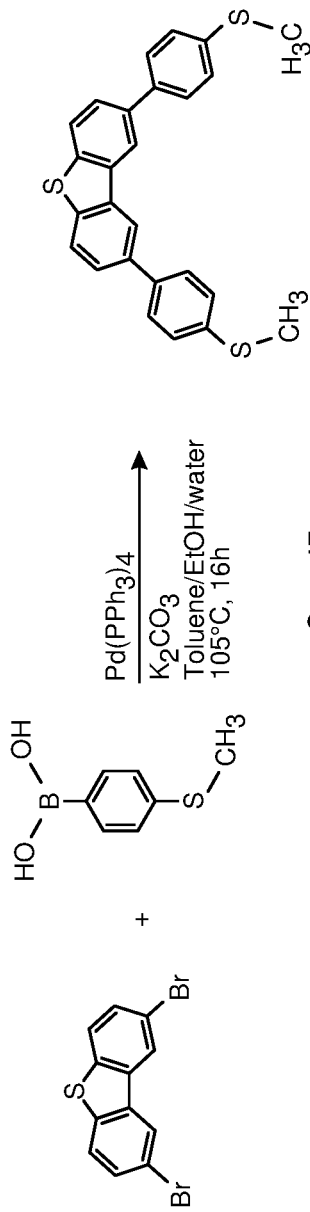
Figure 3:
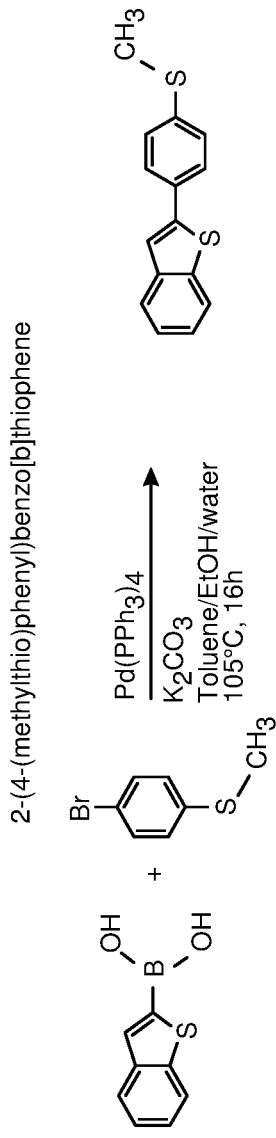
Figure 3:
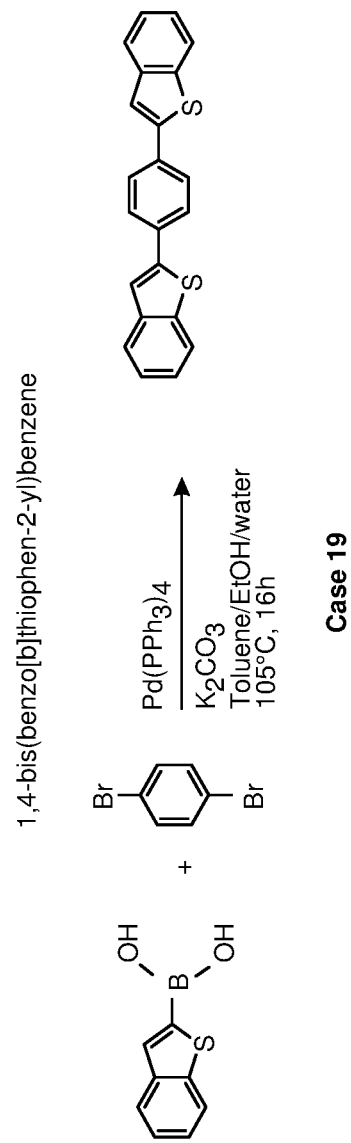

Referring to FIG. 3, shown schematically are example synthesis paths (Cases 1-19) for forming small molecule organic precursors in accordance with various embodiments.

Case 1—9,10-bis(4-(methylthio)phenyl)anthracene 15 mL of water and 20 mL of toluene were added to 100 mL 2 neck round bottom flask under vacuum and purged with $N_2$ three times. The $N_2$ was bubbled through the solution for another 10 min. 9,10-dibromoanthracene (2 g, 0.00595 mol), 4-thiomethylphenylboronic acid (2.50 g, 0.01488 mol) cesium carbonate (9.696 g, 0.02976 mol), and palladium dppf (0.243 g, 0.0002976 mol) were all added to the reaction flask and the solution was sparged with nitrogen for another 10 minutes. The reaction was then heated to 111° C. and refluxed for 16 hours. After 16 hours the reaction was allowed to cool to room temperature. The reaction was worked up by adding 100 mL of water and extracting 3 times with dichloromethane. The organic phase was washed once with water, once with brine solution, dried over magnesium sulfate, and concentrated. The reaction was purified by slow precipitation from chloroform with methanol. The product was a white solid, yield 0.809 g (0.00191 mol, 32.1%); 1H-NMR (80 MHz CDCl$_3$) δ 8.67-8.56 (m, 4H), 7.75-7.37 (m, 12H), 2.62 (s, 6H); LC/MS [M]$^+$ 422.1 m/z.

Case 2—trimethyl((4-(methylthio)phenyl)ethynyl)silane

To a dry 250 mL 2-neck round bottom (4-iodophenyl)(methyl)sulfane (10 g, 0.0399 mol), PdCl$_2$(PPh$_3$)$_2$ (1.122 g, 0.0016 mol) and CuI, (0.609 g, 0.00319 mol) were added and purged 3 times with $N_2$. 100 mL of anhydrous DMF and diisopropylethylamine (31.342 mL, 23.313 g, 0.180 mol) were added to the 250 round bottom. The solution was then stirred and sparged with $N_2$ for 20 minutes. Trimethylsilylethyne (8.367 mL, 5.79 g, 0.0590 mol) was then added dropwise over 1 hour. The solution was then heated to 50° C. and sparged with $N_2$ for another 10 minutes. The reaction was then stirred at 50° C. overnight. The reaction was allowed to cool to room temperature and the then crude product was precipitated with water and filtered. The crude product was dissolved in chloroform then washed 1× with water, 1× with saturated sodium thiosulfate, 1× with water, 1× with saturated NaCl solution, dried over magnesium sulfate and concentrated. Crude product was purified via Kugelrohr sublimation at 190° C. to give of pale yellow solid, yield 7.274 g (0.033 mol, 82.7%); 1H-NMR (80 MHz $CDCl_3$) δ 7.40-7.29 (m, 2H), 7.23-7.07 (m, 2H), 2.45 (s, 3H), 0.22 (s, 9H); LC/MS $[M]^+H$ 221.0 m/z.

Case 3—(4-ethynylphenyl)(methyl)sulfane

To a 100 mL round bottom trimethyl((4-(methylthio) phenyl)ethynyl)silane (3.602 g, 0.0163 mol) and potassium carbonate (4.517 g, 0.0327 mol) were added and dissolved in 30 mL of THF and 30 mL of MeOH and stirred at room temperature overnight. The reaction was quenched with 5 mL of 1M HCl then diluted with 250 mL of water. The pH of the solution was then adjusted to between 1 and 2 with concentrated HCl. The product was extracted with diethyl ether 4×30 mL. The organic layer was washed with saturated NaCl solution and dried over sodium sulfate, filtered and concentrated to give a clear liquid yield 2.288 g (0.0154 mol, 94%); 1H-NMR (400 MHz $CDCl_3$) δ 7.43-7.34 (m, 2H), 7.21-7.13 (m, 2H), 3.07 (s, 1H), 2.48 (s, 3H); 13C-NMR (101 MHz, $CDCl_3$) δ 139.94, 132.27, 125.64, 118.19, 83.33, 15.18; LC/MS $[M]^+$ Na 171.7 m/z.

Case 4—1,2-bis(4-(methylthio)phenyl)ethyne

To a dry 100 mL 2-neck round bottom (4-iodophenyl) (methyl)sulfane (2.970 g, 0.0118 mol), $PdCl_2(PPh_3)_2$, (0.335 g, 0.0004 mol) and CuI, (0.181 g, 0.00095 mol) were added and purged with $N_2$ 3 times. 50 mL of anhydrous DMF and diisopropylethylamine (8.068 mL, 5.986 g, 0.0463 mol) were added to the 100 mL round bottom, and the solution was then stirred and sparged with $N_2$ for 20 minutes. (4-ethynylphenyl)(methyl)sulfane (2.288 g, 0.0154 mol) was then added dropwise over 1 hour. The solution was then heated to 50° C. and sparged with $N_2$ for another 10 minutes. The reaction was then stirred at 50° C. overnight. The reaction was allowed to cool to room temperature and the then crude product was precipitated with water and filtered. The crude solid product was washed 3× with water, 2× with MeOH, 3× with saturated sodium thiosulfate, 3× with MeOH, 3× hexanes. The brown solid was then dissolved in chloroform and then concentrated. The crude solid was placed in the Kugelrohr and purified by sublimation at 190° C. to give a pale yellow solid, yield 2.518 g (0.00931 mol, 78.9%); 1H-NMR (400 MHz $CDCl_3$) δ 7.44-7.39 (m, 4H), 7.22-7.18 (m, 4H), 2.50 (s, 6H); 13C-NMR (101 MHz, $CDCl_3$) δ 139.28, 131.85, 125.97, 119.66, 89.34, 15.47; LC/MS $[M]^+$270.1 m/z.

Case 5—(4-((4-chlorophenyl)ethynyl)phenyl) (methyl)sulfane

To a dry 100 mL 2-neck round bottom 1-chloro-4-iodobenzene (1.443 g, 0.006052 mol), $PdCl_2(PPh_3)_2$, (0.170 g, 0.00024 mol) and CuI, (0.092 g, 0.000484 mol) were added and purged with $N_2$ 3 times. 25 mL of anhydrous DMF and diisopropylethylamine (4.111 mL, 3.050 g, 0.02360 mol) were added to the 100 mL round bottom. The solution was then stirred and sparged with $N_2$ for 20 minutes. (4-ethynylphenyl)(methyl)sulfane (1.17 g, 0.007867 mol) was then added dropwise over 1 hour. The solution was then heated to 50° C. and sparged with $N_2$ for another 10 minutes. The reaction was then stirred at 50° C. overnight. The product was extracted by washing 3×30 mL dichloromethane, washed 3× with water, 1× saturated sodium chloride solution, dried over magnesium sulfate and concentrated. The brown solid was then dissolved in chloroform and then concentrated. The crude solid was placed in the Kugelrohr and purified by sublimation at 150° C. to give a pale yellow solid, yield 1.220 g (0.004729 mol, 78.1%); 1H-NMR (80 MHz $CDCl_3$) δ 7.52-7.27 (m, 6H), 7.26-7.14 (m, 2H), 2.50 (s, 3H); LC/MS $[M]^+$258.0.

Case 6—trimethyl((4-(trifluoromethyl)phenyl)ethynyl)silane

To a dry 100 mL 2-neck round bottom 1-iodo-4-(trifluoromethyl)benzene (10 g, 0.03676 mol), $PdCl_2(PPh_3)_2$ (0.850 g, 0.0007352 mol) and CuI, (0.280 g, 0.00147 mol) were added and purged with $N_2$ 3 times. 50 mL of anhydrous THF and triethylamine (7.685 mL, 5.58 g, 0.05514 mol) were added to the 100 round bottom and the solution was then stirred and sparged with $N_2$ for 20 minutes. Trimethylsilylethyne (5.642 mL, 3.972 g, 0.04094 mol) was then added dropwise over 30 minutes. The solution was then heated to 50° C. and sparged with $N_2$ for another 10 minutes. The reaction was then stirred at 50° C. overnight. The product was extracted by washing 3×50 mL with dichloromethane. The organic layers were combined and washed 3× with water, 1× saturated sodium chloride solution, dried over magnesium sulfate and concentrated. Crude product was purified via Kugelrohr sublimation at approximately 160° C. to give of pale yellow solid, yield 7.141 g (0.02947 mol, 80.2%); 1H-NMR (80 MHz $CDCl_3$) δ 7.56 (s, 4H), 0.27 (s, 9H); 19F-NMR (80 MHz $CDCl_3$) δ 61; LC/MS $[M]^+H$ 244.2 m/z.

Case 7—1-ethynyl-4-(trifluoromethyl)benzene

To a 250 mL round bottom trimethyl((4-(trifluoromethyl) phenyl)ethynyl)silane (7.141 g, 0.02794 mol) and potassium carbonate (7.723 g, 0.05588 mol) were added then dissolved in 60 mL of THF and 60 mL of MeOH and stirred at room temperature overnight. The reaction was quenched with 5 mL of 1M HCl then diluted with 250 mL of water. The pH of the solution was then adjusted to between 1 and 2 with concentrated HCl. The product was extracted with diethyl ether 4×30 mL. The organic layer was washed with saturated NaCl solution and dried over sodium sulfate, filtered, and concentrated to give a pale yellow. The crude reaction yield was 5.013 g (0.02947 mol, >99%); 1H-NMR (80 MHz $CDCl_3$) δ 7.60 (s, 4H), 3.21 (s, 1H); LC/MS $[M]^+H$ 171.0 m/z.

Case 8—methyl(4-((4-(trifluoromethyl)phenyl)ethynyl)phenyl)sulfane

To a dry 100 mL 2-neck round bottom (4-iodophenyl) (methyl)sulfane (2.361 g, 0.0944 mol), $PdCl_2(PPh_3)_2$, (0.265 g, 0.0003775 mol) and CuI, (0.144 g, 0.0007552 mol) were added and purged with $N_2$ 3 times. 40 mL of anhydrous dimethylacetamide and diisopropylethylamine (4.934 mL, 3.661 g, 0.02832 mol) were added to the 100 mL round bottom and the solution was then stirred and sparged with $N_2$ for 20 minutes. 1-ethynyl-4-(trifluoromethyl)benzene (2.089 g, 0.01227 mol) was then added dropwise over 1 hour. The solution was then heated to 50° C. and sparged with $N_2$ for another 10 minutes. The reaction was then stirred at 50° C. overnight. The product was extracted by washing 3×25 mL dichloromethane, The organic layers were combined and washed 3× with water, 1× saturated sodium chloride solution, dried over magnesium sulfate and concentrated. The crude solid was placed in the Kugelrohr and purified by sublimation between 120-130° C. to give a pale yellow solid, yield 1.698 g (0.0058 mol, 62%); 1H-NMR (80 MHz $CDCl_3$) δ 7.60 (s, 4H), 7.51-7.41 (m, 2H), 7.26-7.16 (m, 2H), 2.51 (s, 3H); 19F-NMR (80 MHz $CDCl_3$) δ; $[M]^+H$ 293.2 m/z.

Case 9—((4-fluorophenyl)ethynyl)trimethylsilane

To a dry 100 mL 2-neck round bottom 1-bromo-4-fluorobenzene (3.125 mL, 5 g, 0.02857 mol), $PdCl_2(PPh_3)_2$ (0.802 g, 0.0001143 mol) and CuI, (0.435 g, 0.002286 mol) were added and purged with $N_2$ 3 times. 50 mL of anhydrous Dimethylacetamide and diisopropylethylamine (14.928 mL, 8.571 g, 0.08571 mol) were added to the 100 round bottom the solution was then stirred and sparged with $N_2$ for 20 minutes. Trimethylsilylethyne (5.980 mL, 4.21 g, 0.04286 mol) was then added dropwise over 20 minutes. The solution was then heated to 120° C. and sparged with $N_2$ for another 10 minutes. The reaction was then stirred at 120° C. overnight. The reaction was allowed to cool to room temperature and then water was added to quench the reaction. The product was extracted by washing 3×50 mL with dichloromethane. The organic layers were combined and washed 3× with water, 1× saturated sodium chloride solution, dried over magnesium sulfate and concentrated. Crude product was carried forward without further purification, yield 1.029 g (0.00535 mol, 18.7%); 1H-NMR (80 MHz $CDCl_3$) δ 7.54-7.26 (m, 2H), 7.09-6.88 (m, 2H), 0.22 (s, 9H); 19F-NMR (80 MHz $CDCl_3$) δ 108; LC/MS $[M]^+$ 192.2 m/z.

Case 10—1-ethynyl-4-fluorobenzene

To a 50 mL round bottom ((4-fluorophenyl)ethynyl)trimethylsilane (1.51 g, 0.007852 mol) and potassium carbonate (2.170 g, 0.01570 mol) were added then dissolved in 10 mL of THF and 10 mL of MeOH and stirred at room temperature overnight. The reaction was quenched with 5 mL of 1M HCl then diluted with 250 mL of water. The pH of the solution was then adjusted to between 1 and 2 with concentrated HCl. The product was extracted with diethyl ether 4×30 mL. The organic layer was washed with saturated NaCl solution and dried over sodium sulfate, filtered, and concentrated to give a tan liquid. The crude product was carried forward without purification, yield 0.943 g (0.0.007852 mol, >99% %); LC/MS $[M]^+H$ 121.4 m/z.

Case 11—1,2-bis(4-fluorophenyl)ethyne

To a dry 50 mL 2-neck round bottom 1-bromo-4-fluorobenzene (0.661 mL, 1.057 g, 0.00604 mol), $PdCl_2(PPh_3)_2$, (0.170 g, 0.0002416 mol) and CuI, (0.092 g, 0.0004832 mol) were added and purged with $N_2$ 3 times. 20 mL of anhydrous dimethylacetamide and diisopropylethylamine (3.156 mL, 2.342 g, 0.01812 mol) were added to the 50 mL round bottom and the solution was then stirred and sparged with $N_2$ for 20 minutes. 1-ethynyl-4-fluorobenzene (0.943 g, 0.007852 mol) was then added dropwise over 1 hour. The solution was then heated to 50° C. and sparged with $N_2$ for another 10 minutes. The reaction was then stirred at 50° C. overnight. The reaction was allowed to cool to room temperature and the then quenched by adding 100 mL of water. The crude solid product was washed 3× with water, 2× with MeOH, 3× with saturated sodium thiosulfate, 3× with MeOH, 3× hexanes. The brown solid was then dissolved in chloroform and then concentrated, to give a crude yellow solid. 1H-NMR (80 MHz $CDCl_3$) δ 7.61-6.88 (m, 8H); 19F-NMR (80 MHz $CDCl_3$) δ 106; LC/MS $[M]^+$ 214.0.

Case 12—(dibenzo[b,d]thiophen-4-ylethynyl)trimethylsilane

To a dry 100 mL 2-neck round bottom 4-bromodibenzo[b,d]thiophene (3 g, 0.011398 mol), Pd $(PPh_3)_4$, (0.527 g, 0.00046 mol) and CuI, (0.174 g, 0.00091 mol) were added and purged with $N_2$ 3 times. 30 mL of anhydrous THF and triethylamine (1.907 mL, 1.384 g, 0.01368 mol) were added to the 100 mL round bottom the solution was then stirred and sparged with $N_2$ for 20 minutes. (4-ethynylphenyl)(methyl)sulfane (1.894 mL, 1.353 g, 0.0136 mol) was then added dropwise over 1 hour. The solution was then heated to 50° C. and sparged with $N_2$ for another 10 minutes. The reaction was then stirred at 50° C. for 2 hours. The reaction was allowed to cool to room temperature, the product was then crashed out of solution with 100 mL of water. The product was extracted by washing 3×30 mL with dichloromethane, washed 3× with water, 1× saturated sodium chloride solution, dried over magnesium sulfate and concentrated. The crude reaction mixture was purified by flash column chromatography 0 to 25% dichloromethane in hexanes, yield 0.515 g (0.0.0018 mol, 16%); 1H-NMR (80 MHz $CDCl_3$) δ 8.35-7.99 (m, 2H), 7.97-7.77 (m, 1H), 0.35 (s, 9H); LC/MS $[M]^+$ 280.1 m/z.

Case 13—1,2-bis(dibenzo[b,d]thiophen-4-yl)ethyne

To a dry 50 mL 2-neck round bottom 4-bromodibenzo[b,d]thiophene (0.580 g, 0.002203 mol), Pd (dppf) (0.0.013 g, 0.00001836 mol) and CuI, (0.0035 g, 0.000018 mol) were added and purged with $N_2$ 3 times. 5 mL of anhydrous THF was used to dissolve (dibenzo[b,d]thiophen-4-ylethynyl)trimethylsilane (0.515 g, 0.001836 mol) added to the reaction vessel then an additional 5 mL of anhydrous THF was added and the solution was then sparged with $N_2$ for 10 minutes. Then 1 M THF tetrabutylammonium fluoride solution (1.836 mL) and triethylamine (0.307 mL, 0.223 g, 0.02203 mol) were added to the 50 mL round, the reaction was then stirred at 60° C. for 16 hours. The reaction was allowed to cool to room temperature, the product was then crashed out of solution with 50 mL of water. The product was extracted by washing 3×25 mL dichloromethane, washed 3× with water, 1× saturated sodium chloride solution, dried over magnesium sulfate and concentrated. The crude reaction mixture was purified by flash column chromatography 0 to 20% dichloromethane in hexanes, yield 0.045 g (0.0.0001152 mol, 6.2%); LC/MS $[M]^+$ 1-1391.1 m/z.

Case 14—1,4-bis(4-(methylthio)phenyl)buta-1,3-diyne

To a dry 50 mL round bottom trimethyl((4-(methylthio)phenyl)ethynyl)silane (0.500 g, 0.003373 mol), followed by Pd (oAc)2 (0.015 g, 0.00006746 mol) and CuI, (0.013 g, 0.00006746 mol) and (1,4-diazabicyclo[2.2.2]octane (1.135 g, 0.0101 mol). The suspension was then dissolved in 30 mL of acetonitrile and reacted at room temperature overnight open to the air. The reaction was quenched by adding 50 mL of water and then worked up by washing 3×25 mL dichloromethane, washed 3× with water, 1× saturated sodium chloride solution, dried over magnesium sulfate and concentrated. The crude reaction mixture was purified by flash column chromatography 0 to 25% dichloromethane in hexanes, yield 0.034 g (0.0001548 mol, 7%); 1H-NMR (80 MHz CDCl$_3$) δ 7.49-7.32 (m, 4H), 7.22-7.11 (m, 4H), 2.49 (s, 6H); LC/MS [M]$^+$H 295.0 m/z.

Case 15—1,4-diphenylbuta-1,3-diyne

To a dry 50 mL round bottom Pd (oAc)$_2$ (0.015 g, 0.00006746 mol) and purged 3× with N$_2$, then dissolved in 30 mL of acetonitrile. CuI, (0.037 g, 0.0001958 mol) and (1,4-diazabicyclo[2.2.2]octane (3.299 g, 0.2937 mol) were added to the solution followed by phenylacetylene (0.93 mL, 1 g, 0.009791 mol) the solution was then removed for the nitrogen and reacted at room temperature overnight open to the air. The reaction was quenched by adding 50 mL of water and then worked up by washing 3×25 mL dichloromethane, washed 3× with water, 1× saturated sodium chloride solution, dried over magnesium sulfate and concentrated. The crude reaction mixture was purified by flash column chromatography 0 to 25% dichloromethane in hexanes yield 0.430 g (0.002126 mol, 43%); %); 1H-NMR (80 MHz CDCl$_3$) δ 7.61-7.30 (m, 10H); LC/MS [M]$^+$H 203.1 m/z.

Case 16—(E)-1-(3-bromophenyl)-3-(2-chloro-4-hydroxyphenyl)prop-2-en-1-one

In to a dry 100 mL round bottom 2-chloro-4-hydroxybenzaldehyde (2 g, 0.01277 mol) was added and dissolved in 20 mL of 200 proof ethanol. 1-(3-bromophenyl)ethan-1-one was then added to the solution and the reaction was cooled to 0° C. and sodium hydroxide was added slowly to control the exotherm. The reaction was quenched by adding 50 mL of 1 M HCl and then acidified. The reaction was then worked up by washing 3×25 mL ethyl acetate, washed 3× with water, 1× saturated sodium chloride solution, dried over magnesium sulfate and concentrated. The crude reaction mixture was purified by flash column chromatography 0 to 25% ethyl acetate in hexanes, yield 0.154 g (0.0004561 mol, 3.5%); 1H-NMR (400 MHz DMSO-d6) δ 10.60 (s, 1H), 8.30 (t, J=1.9 Hz, 1H), 8.16-8.11 (m, 2H), 8.02 (d, J=15.4 Hz, 1H), 7.90-7.75 (m, 2H), 7.52 (t, J=7.9 Hz, 1H), 6.93 (dd, J=2.4, 0.7 Hz, 1H), 6.85 (dd, J=8.7, 2.4 Hz, 1H); 13C-NMR (101 MHz, DMSO-d6) δ 187.51, 160.82, 139.64, 139.58, 135.97, 135.66, 130.97, 130.94, 130.08, 127.41, 122.86, 122.29, 120.49, 116.26, 115.38; LC/MS [M]$^+$H 338.9 m/z.

Case 17—2,8-bis(4-(methylthio)phenyl)dibenzo[b,d]thiophene

To a 2 neck round bottom flask palladium tetrakis (2.534 g, 0.002193 mol) and potassium carbonate (12.273 g, 0.0888 mol) were added, the reaction flask was placed under and purged 3× with nitrogen. 25 mL of water was added to the reaction flask followed by (4-(methylthio)phenyl)boronic acid (9.947 g, 0.05920 mol), 30 mL of ethanol, 2,8-dibromodibenzo[b,d]thiophene (5 g, 0.01462 mol), and finally 100 mL of toluene. Nitrogen was bubbled through the reaction mixture for 20 minutes. The reaction was then heated to 105° C. under N$_2$ for 16 hours. Upon cooling the reaction to room temperature the desired product precipitated from solution. The product was then washed with ethanol and dried under vacuum, yield 5.92 g (0.0138 mol, 94%); 1H-NMR (400 MHz CDCl$_3$) δ 8.38 (d, J=0.7 Hz, 1H), 7.92 (dd, J=8.4, 0.9 Hz, 2H), 7.70 (d, J=8.3 Hz, 1H), 8.02 (d, J=15.4 Hz, 1H), 7.68-7.59 (m, 4H), 7.43-7.35 (m, 4H); 13C-NMR (101 MHz, CDCl$_3$) δ 139.00, 137.98, 137.78, 137.39, 136.16, 127.76, 127.18, 126.10, 123.26, 119.77, 16.04; LC/MS [M]$^+$ 428.1 m/z.

Case 18—2-(4-(methylthio)phenyl)benzo[b]thiophene

To a 2 neck 50 mL round bottom flask palladium tetrakis (1.768 g, 0.00153 mol) and potassium carbonate (2.222 g, 0.01608 mol) were added, the reaction flask was placed under and purged 3× with nitrogen. 5 mL of water was added to the reaction flask followed by (4-bromophenyl)(methyl)sulfane (2.073 g, 0.0100 mol), 6 mL of ethanol, benzo[b]thiophen-2-ylboronic acid (1.908 g, 0.0172 mol), and finally 20 mL of toluene. Nitrogen was bubbled through the reaction mixture for 20 minutes; the reaction was then heated to 105° C. under N$_2$ for 16 hours. The reaction was cooled to room temperature then quenched with 50 mL of water. The reaction was then worked up by washing 3×25 mL ethyl acetate, the organic layers were combined and washed 3× with water, 1× saturated sodium chloride solution, dried over magnesium sulfate and concentrated. The crude reaction mixture was purified by flash column chromatography 0 to 25% ethyl acetate in hexanes, yield 0.250 g (0.000097 mol, 9.7%); 1H-NMR (400 MHz CDCl$_3$) δ 7.82 (ddd, J=7.7, 1.5, 0.8 Hz, 1H), 7.78-7.73 (m, 1H), 7.70 (d, J=8.3 Hz, 1H), 7.69-7.59 (m, 1H), 7.51 (d, J=0.8 Hz, 1H), 7.39-7.27 (m, 4H), 2.52 (s, 3H); 13C-NMR (101 MHz, CDCl$_3$) δ 143.79, 140.78, 139.36, 139.00, 131.14, 126.83, 126.80, 124.98, 124.85, 124.60, 124.33, 123.78, 123.51, 122.29, 122.24, 121.46, 119.09, 15.76; LC/MS [M]$^+$H 257.0.

Case 19—1,4-bis(benzo[b]thiophen-2-yl)benzene

To a 2 neck 50 mL round bottom flask palladium tetrakis (1.470 g, 0.001272 mol) and potassium carbonate (5.361 g, 0.03879 mol) were added, the reaction flask was placed under and purged 3× with nitrogen. 10 mL of water was added to the reaction flask followed by 1,4-dibromobenzene (2 g, 0.008478 mol), 13 mL of ethanol, benzo[b]thiophen-2-ylboronic acid (4.603 g, 0.0258 mol), and finally 30 mL of toluene. Nitrogen was bubbled through the reaction mixture for 20 minutes; the reaction was then heated to 105° C. under N$_2$ for 16 hours. The reaction was cooled to room temperature then quenched with 50 mL of water. The reaction was then worked up by washing 3×25 mL ethyl acetate, the organic layers were combined and washed 3× with water, 1× saturated sodium chloride solution, dried over magnesium sulfate and concentrated. The crude reaction mixture was purified by flash column chromatography 0 to 25% ethyl acetate in hexanes, yield 0.208 g (0.00061 mol, 7.1 1H-NMR (80 MHz CDCl$_3$) δ 7.84-7.72 (m, 4H), 7.56 (s, 6H), 7.45-7.26 (m, 4H); [M]$^+$ 342.0 m/z.

The synthesis paths and the resulting small molecules disclosed in Cases 1-19 are exemplary and merely illustrative. Additional processes and products are contemplated. According to some embodiments, melts, solutions, suspensions, etc. of one or more organic molecules may be used to form high refractive index and highly birefringent organic solid crystal (OSC) thin films.

Figure 4:
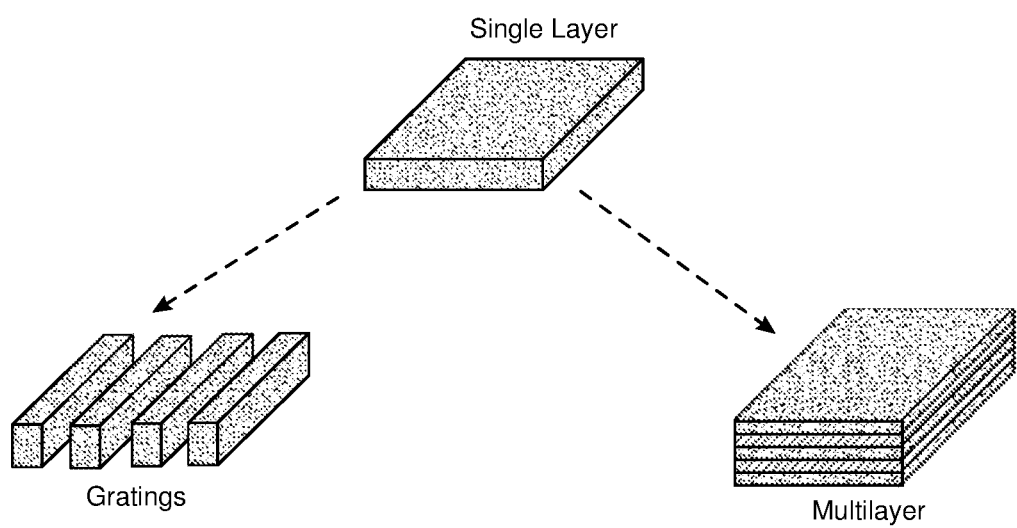
FIG. 4 illustrates example thin film, grating, and multilayer architectures that include organic solid crystal materials according to various embodiments.
Figure 5:
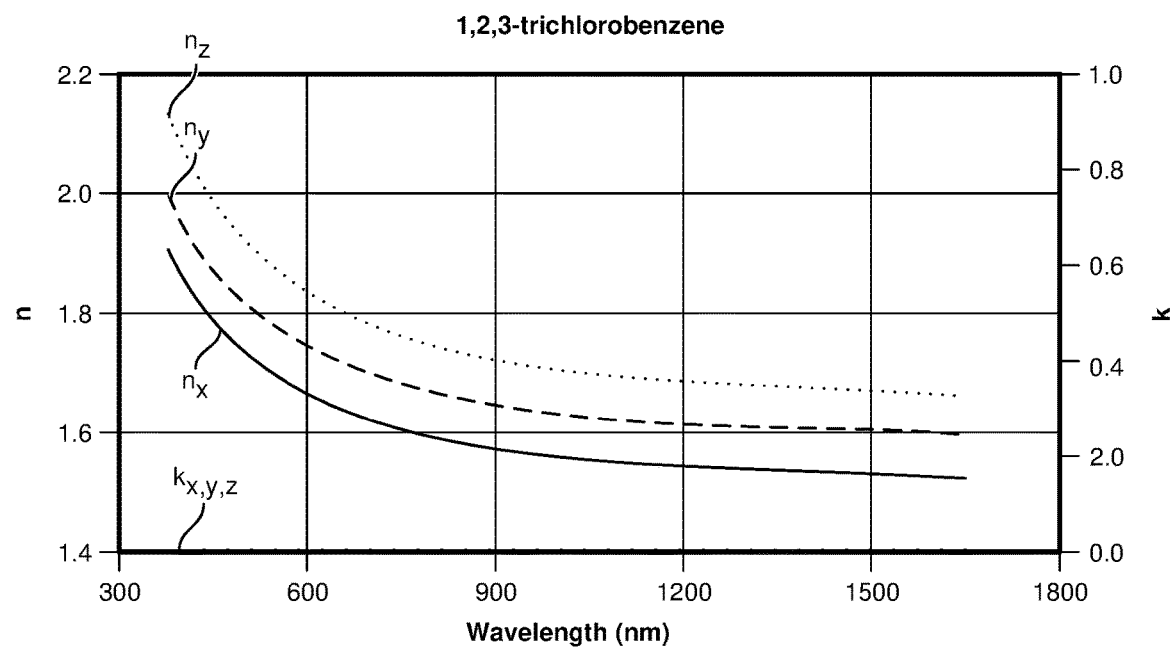
FIG. 5 shows refractive index data for 1,2,3-trichlorobenzene according to some embodiments.
Figure 6:
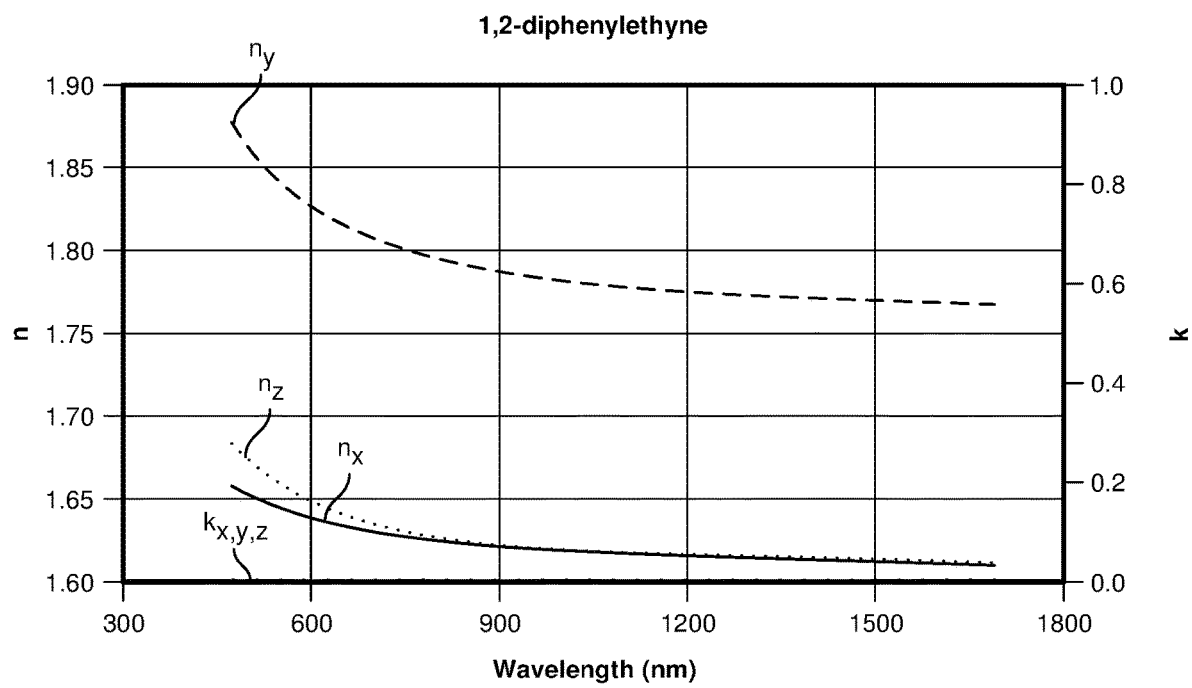
FIG. 6 shows refractive index data for 1,2-diphenylethyne according to some embodiments.
Figure 7:
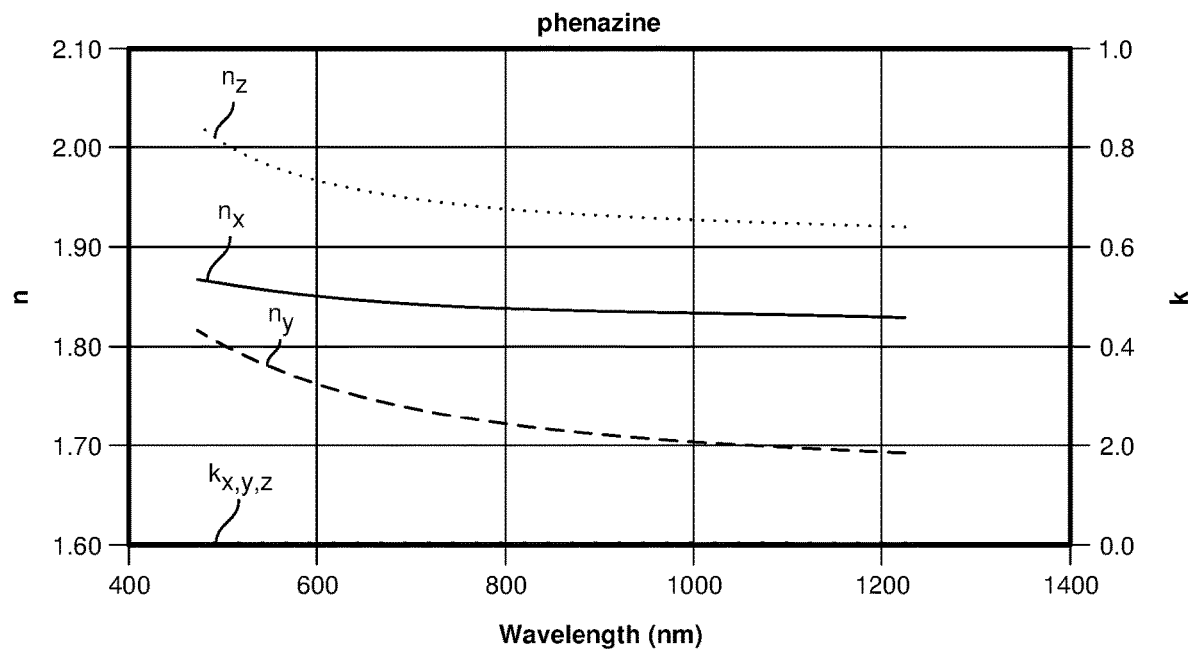
FIG. 7 shows refractive index data for phenazine according to some embodiments.
Figure 8:
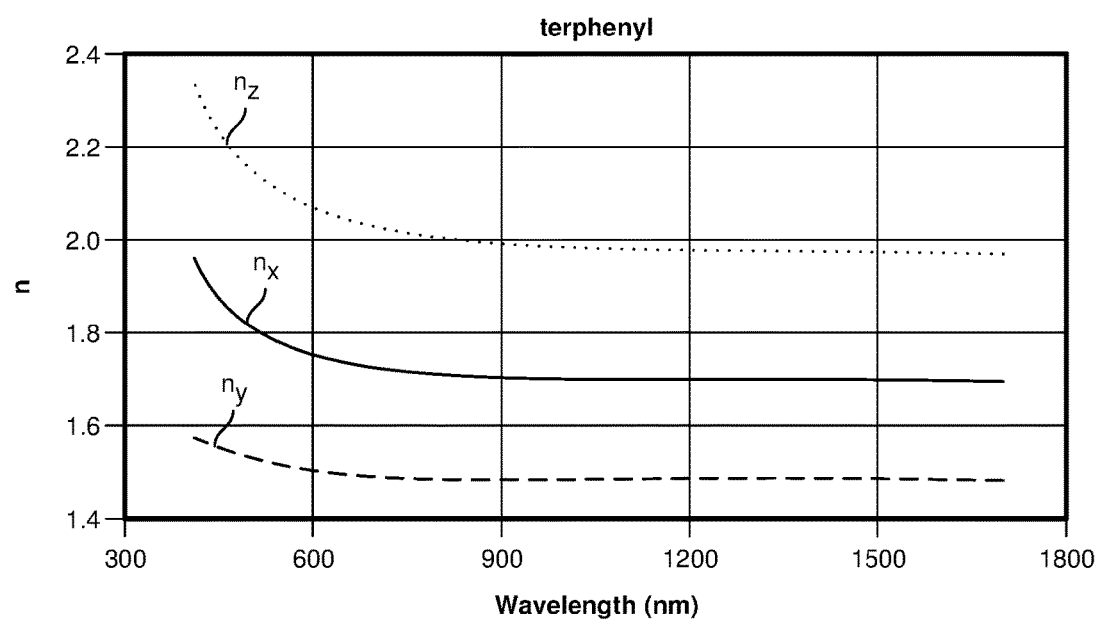
FIG. 8 shows refractive index data for terphenyl according to some embodiments.
Figure 9:
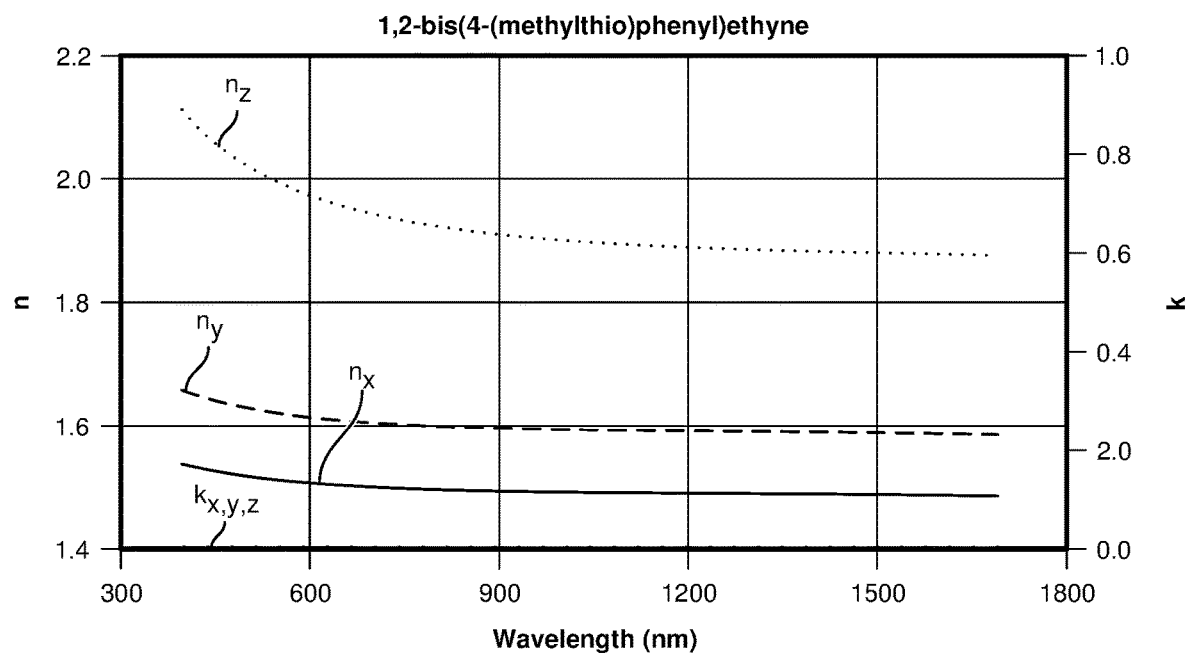
FIG. 9 shows refractive index data for 1,2-bis(4-(methylthio)phenyl)ethyne according to some embodiments.
Figure 10:
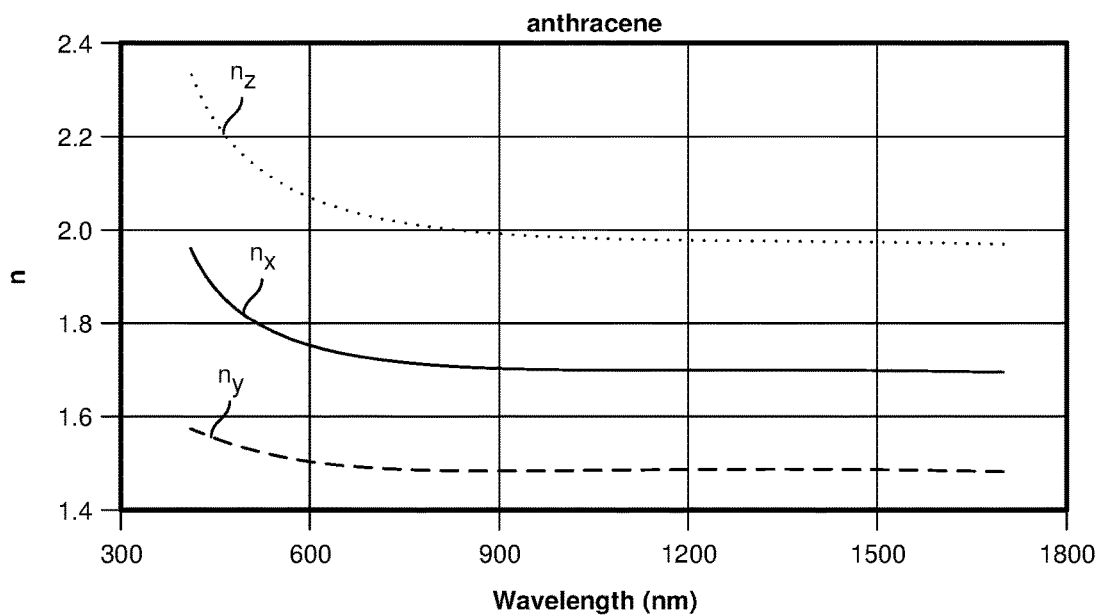
FIG. 10 shows refractive index data for anthracene according to some embodiments.

Thin film, grating, and multilayer OSC architectures are depicted in FIG. 4. In some embodiments, a single layer thin film having a refractive index of at least approximately 2.3 and a thickness of approximately 500 micrometers may be implemented as a waveguide substrate. A thinner OSC thin film (100-300 micrometers) may be used as an efficiency enhancement layer. For polarization management, a OSC thin film may have a refractive index of at least approximately 2.2, a thickness of less than approximately 5 micrometers, and birefringence of at least approximately 0.4.

Grating architectures may be incorporated into waveguide coupling elements, photonic integrated circuits, or high resolution Fresnel lenses. An example coupling element may have a refractive index of at least approximately 2.3, a thickness of at least approximately 1 micrometer, and birefringence of at least approximately 1.4. A photonic integrated circuit may include a curved grating architecture formed from an OSC material having a refractive index of at least approximately 1.9 at 940 nm. A Fresnel lens grating may include a OSC-material having a refractive index of at least approximately 2.2. Multilayer OSC thin films may be incorporated into a projector, for example, as a brightness enhancement layer.

Dispersion curves for organic solid crystal thin films having the OSC compositions of Table 1 are shown in FIGS. 5-10. The measured data show that a through thickness refractive index ($n_\perp$) for the organic solid crystal thin films is greater than approximately 1.6 (e.g., greater than approximately 1.7 or greater than approximately 1.8) across the visible spectrum.

Figure 11:
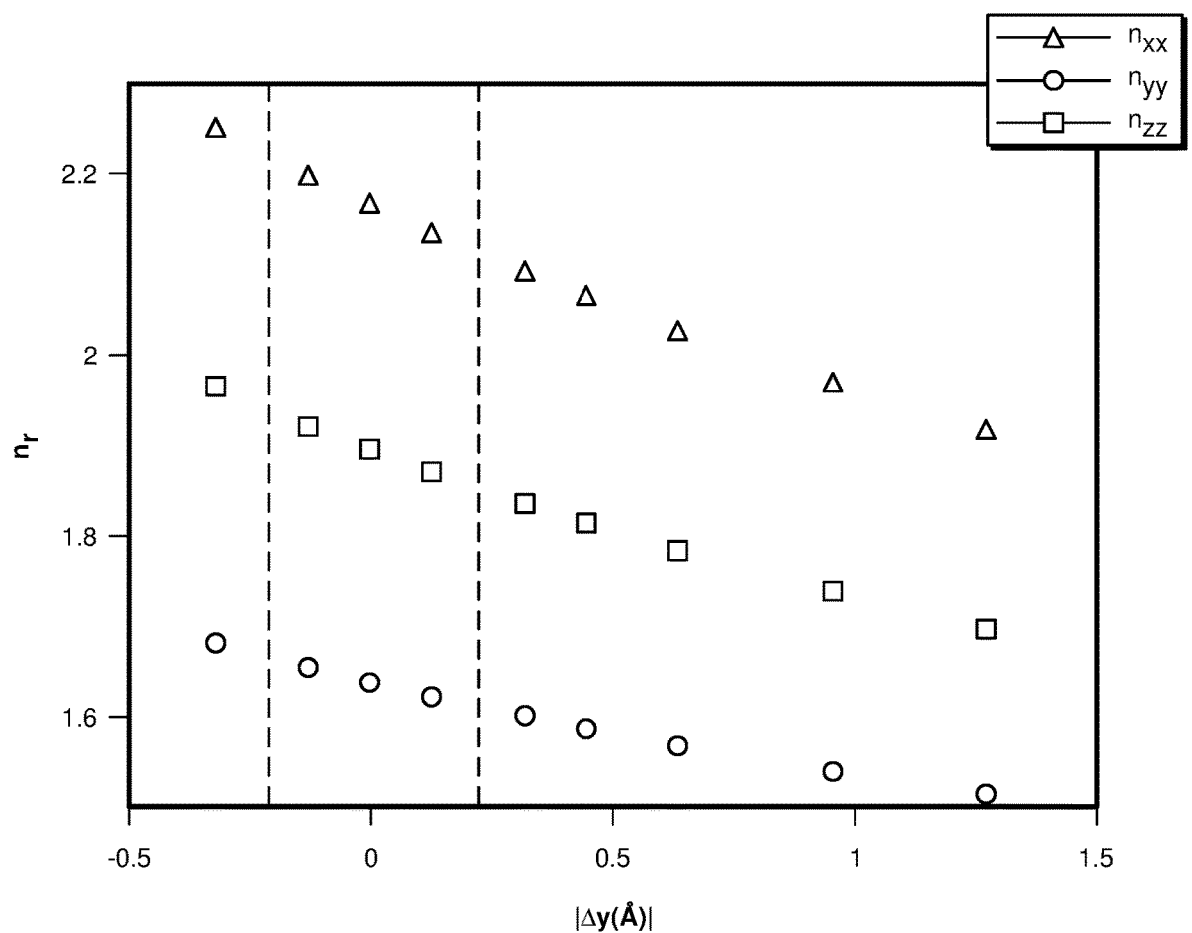
FIG. 11 presents modeled data showing the impact of induced strain on the refractive index of an example organic solid crystal material according to certain embodiments.
Figure 12:
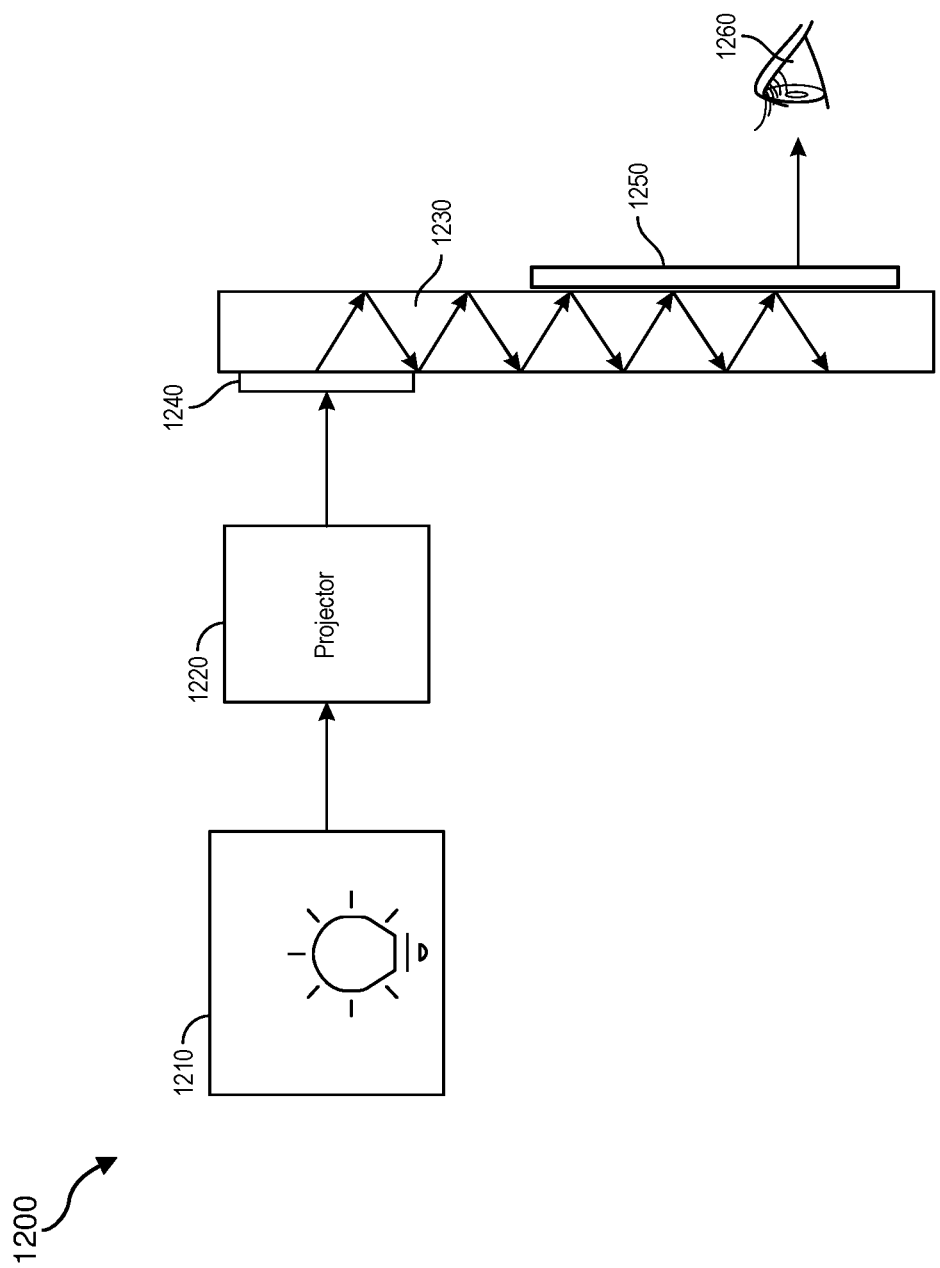
FIG. 12 illustrates the incorporation of organic solid crystal structures into example optical elements according to some embodiments.

Referring to FIG. 11, shown are computation data demonstrating the strain-induced modification of refractive index of an organic solid crystal. The illustrated data show a change in refractive index of approximately ±0.1 with the application of ±5% strain. According to some embodiments, a refractive index may be tuned by straining, compressing, or stretching the crystal, e.g., along its z-axis.

Referring to FIG. 12, illustrated is an example optical display. Optical display 1200 may include a light source 1210, a projector 1220 optically coupled to the light source 1210, and an optical waveguide 1230 optically coupled to the projector output and configured to combine two or more images output by the projector 1220. Input coupler 1240 and output coupler 1250 may be configured to respectively direct image light into and out of the waveguide 1230, and to a user 1260.

According to some embodiments, a highly birefringent organic solid crystal thin film or multilayer may be incorporated into the light source 1210 to provide brightness enhancement of the output light. A high refractive index and highly birefringent OSC thin film or multilayer may be incorporated into the projector 1220 to provide polarization management and promote efficient operation thereof. In some embodiments, incorporation of a high refractive index OSC layer or multilayer into waveguide 1230 may improve display and see-through performance. Incorporated into the input coupler 1240 or the output coupler 1250, a high refractive index and highly birefringent OSC thin film or multilayer may enhance display performance and provide polarization management.

Example OSC materials include small molecules, macromolecules, liquid crystals, organometallic compounds, oligomers, and polymers, and may include organic semiconductors such as polycyclic aromatic compounds, e.g., anthracene, phenanthrene, and the like. Methods of manufacturing organic solid crystals may include crystal growth from a melt or solution, chemical or physical vapor deposition, and solvent coating onto a substrate. A deposition surface of the substrate may be treated globally or locally to impact, for example, nucleation density, crystalline orientation, adhesion, surface roughness, etc. The foregoing methods may be applied in conjunction with one or more optional post-deposition steps, such as annealing, polishing, dicing, etc., which may be carried out to improve one or more OSC attributes, including crystallinity, thickness, curvature, and the like.

Disclosed are methods for forming a birefringent organic solid crystal thin film having a high refractive index. In particular embodiments, the method may be used to control the surface roughness of the thin film without the need for post-formation slicing, grinding, and polishing. Using a seed crystal to nucleate an organic solid crystal from a liquid phase containing an organic precursor, in an example method, an organic solid crystal thin film may be cast or molded using a non-volatile medium material (e.g., oil) to template crystal growth.

In some embodiments, an organic precursor may be deposited directly over a layer of a non-volatile medium material, which may provide a smooth interface for the formation of the organic thin film. Thermal processing may be used to induce nucleation and growth of the organic solid crystal phase.

In further embodiments, a mixture containing an organic precursor and a non-volatile medium material may be deposited over a substrate. Thermal processing may be used to induce homogeneous mixing, and subsequent phase separation of the organic precursor and the non-volatile medium material, as well as nucleation and growth of the organic solid crystal phase. During nucleation and growth, according to various embodiments, at least one surface of the thin film may directly contact the non-volatile medium material, which may be effective to mediate molecular-level surface roughness of the nascent organic crystal(s). If provided, a substrate may be patterned to include a 3D structure that is incorporated into the over-formed thin film.

An organic solid crystal thin film may include an organic crystalline phase and may be characterized by a refractive index of at least approximately 1.5 at 589 nm, and a surface roughness (e.g., over an area of at least 1 cm$^2$ and independent of surface features such as gratings, etc.) of less than approximately 10 micrometers. The organic solid crystal thin film may be single crystal and may be characterized by three mutually orthogonal and disparate refractive indices.

A high refractive index, highly birefringent solid organic material may be incorporated into next generation optoelectronic devices. Solid organic materials having higher than anticipated refractive indices and birefringence may be formed from anisotropic organic small molecules. High refractive index and high birefringent anisotropic small molecule-based solid organic materials enable the formation of active and passive optoelectronic elements that can be tuned to exhibit desired mechanical and optical properties.

Example processes may be integrated with a real-time feedback loop that is configured to assess one or more attributes of the organic solid crystal thin film and accordingly adjust one or more process variables, including melt temperature, substrate temperature, draw rate, etc. Resultant organic solid crystal structures may be incorporated into optical elements such as AR/VR headsets and other devices, e.g., waveguides, prisms, Fresnel lenses, and the like.

EXAMPLE EMBODIMENTS

Example 1: An organic thin film includes an organic solid crystal material, the organic thin film having mutually orthogonal refractive indices ($n_x$, $n_y$, $n_z$), where $n_x$, $n_y$, and $n_z$ each have a value at 589 nm between approximately 1.5 and approximately 2.6, and $n_x \neq n_y \neq n_z$.

Example 2: The organic thin film of Example 1, where the organic solid crystal material includes a single crystal material or a polycrystalline material.

Example 3: The organic thin film of any of Examples 1 and 2, where the organic solid crystal material includes a glassy material having molecules aligned along predetermined directions.

Example 4: The organic thin film of any of Examples 1-3, where $\Delta n_{xy} < \Delta n_{xz} < \Delta n_{yz}$ or $\Delta n_{xy} < \Delta n_{yz} < \Delta n_{xz}$.

Example 5: The organic thin film of any of Examples 1-4, where $2\Delta n_{xy} < \Delta n_{xz}$ or $2\Delta n_{xy} < \Delta n_{yz}$.

Example 6: The organic thin film of any of Examples 1-5, where $3\Delta n_{xy} < \Delta n_{xz}$ and $3\Delta n_{xy} < \Delta n_{yz}$.

Example 7: The organic thin film of any of Examples 1-6, where $\Delta n_{xy} = \Delta n_{xz} < \Delta n_{yz}$ or $\Delta n_{xy} = \Delta n_{yz} < \Delta n_{xz}$.

Example 8: The organic thin film of any of Examples 1-7, where $\Delta n_{xz} < \Delta n_{xy} = \Delta n_{yz}$ or $\Delta n_{yz} < \Delta n_{xy} = \Delta n_{xz}$.

Example 9: The organic thin film of any of Examples 1-8, where $10\Delta n_{xz} < \Delta n_{xy} = \Delta n_{yz}$ or $10\Delta n_{yz} < \Delta n_{xy} = \Delta n_{xz}$.

Example 10: The organic thin film of any of Examples 1-9, where $n_z$ is at least approximately 1.8 across the visible spectrum and the organic thin film has an out-of-plane birefringence of at least approximately 0.2.

Example 11: The organic thin film of any of Examples 1-10, where the organic solid crystal material is at least approximately 80% crystalline.

Example 12: The organic thin film of any of Examples 1-11, where a surface of the thin film has a profile selected from planar, convex, and concave.

Example 13: The organic thin film of any of Examples 1-12, where the organic solid crystal material includes an organic molecule selected from 1,2,3-trichlorobenzene, 1,2-diphenylethyne, phenazine, terphenyl, 1,2-bis(4-(methylthio)phenyl)ethyne, and anthracene.

Example 14: An optoelectronic device including an organic multilayer thin film, where each layer in the organic multilayer thin film includes the organic thin film of any of Examples 1-13.

Example 15: An organic solid crystal material includes mutually orthogonal refractive indices ($n_1$, $n_2$, $n_3$), where $n_1$, $n_2$, and $n_3$ each have a value at 589 nm of between approximately 1.5 and approximately 2.6, and $n_1 \neq n_2 \neq n_3$.

Example 16: The organic solid crystal material of Example 15, where the organic solid crystal material is at least approximately 80% crystalline.

Example 17: A method includes forming an organic solid crystal thin film including an organic solid crystal material over a surface of a substrate, the organic solid crystal thin film having mutually orthogonal refractive indices ($n_x$, $n_y$, $n_z$), where $n_x$, $n_y$, and $n_z$ each have a value at 589 nm of between approximately 1.5 and approximately 2.6, and $n_x \neq n_y \neq n_z$.

Example 18: The method of Example 17, where forming the organic solid crystal thin film includes dispensing an organic precursor material over a surface of the substrate, and locally cooling the organic precursor material to form the organic solid crystal thin film.

Example 19: The method of any of Examples 17 and 18, where locally cooling the organic precursor material includes zone annealing.

Example 20: The method of any of Examples 17-19, further including separating the organic solid crystal thin film from the substrate.

Embodiments of the present disclosure may include or be implemented in conjunction with various types of artificial-reality systems. Artificial reality is a form of reality that has been adjusted in some manner before presentation to a user, which may include, for example, a virtual reality, an augmented reality, a mixed reality, a hybrid reality, or some combination and/or derivative thereof. Artificial-reality content may include completely computer-generated content or computer-generated content combined with captured (e.g., real-world) content. The artificial-reality content may include video, audio, haptic feedback, or some combination thereof, any of which may be presented in a single channel or in multiple channels (such as stereo video that produces a three-dimensional (3D) effect to the viewer). Additionally, in some embodiments, artificial reality may also be associated with applications, products, accessories, services, or some combination thereof, that are used to, for example, create content in an artificial reality and/or are otherwise used in (e.g., to perform activities in) an artificial reality.

Artificial-reality systems may be implemented in a variety of different form factors and configurations. Some artificial-reality systems may be designed to work without near-eye displays (NEDs). Other artificial-reality systems may include an NED that also provides visibility into the real world (e.g., augmented-reality system 1300 in FIG. 13) or that visually immerses a user in an artificial reality (e.g., virtual-reality system 1400 in FIG. 14). While some artificial-reality devices may be self-contained systems, other artificial-reality devices may communicate and/or coordinate with external devices to provide an artificial-reality experience to a user. Examples of such external devices include handheld controllers, mobile devices, desktop computers, devices worn by a user, devices worn by one or more other users, and/or any other suitable external system.

Figure 13:
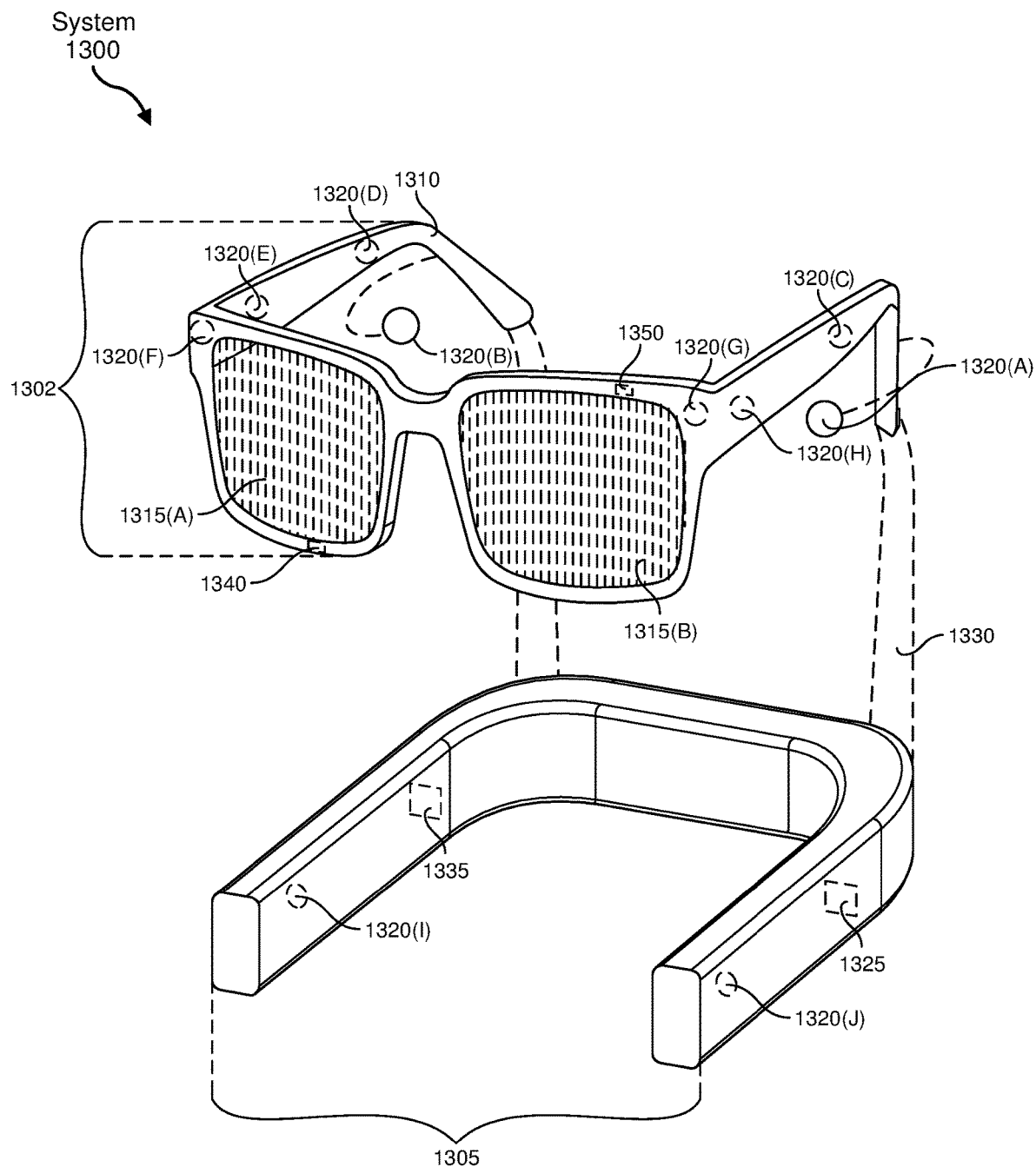
FIG. 13 is an illustration of exemplary augmented-reality glasses that may be used in connection with embodiments of this disclosure.
Figure 14:
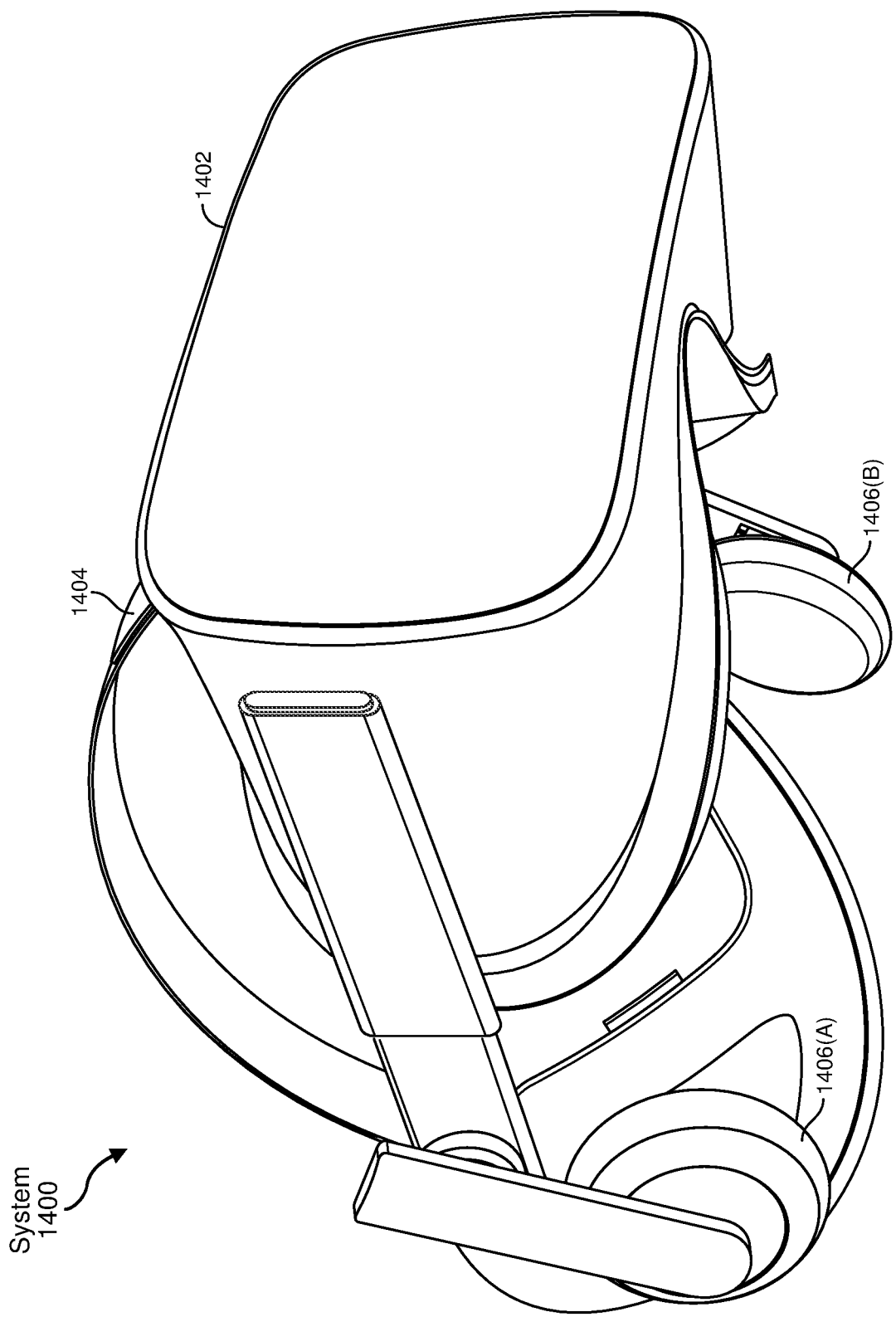
FIG. 14 is an illustration of an exemplary virtual-reality headset that may be used in connection with embodiments of this disclosure.

Turning to FIG. 13, augmented-reality system 1300 may include an eyewear device 1302 with a frame 1310 configured to hold a left display device 1315(A) and a right display device 1315(B) in front of a user's eyes. Display devices 1315(A) and 1315(B) may act together or independently to present an image or series of images to a user. While augmented-reality system 1300 includes two displays, embodiments of this disclosure may be implemented in augmented-reality systems with a single NED or more than two NEDs.

In some embodiments, augmented-reality system 1300 may include one or more sensors, such as sensor 1340. Sensor 1340 may generate measurement signals in response to motion of augmented-reality system 1300 and may be located on substantially any portion of frame 1310. Sensor 1340 may represent a position sensor, an inertial measurement unit (IMU), a depth camera assembly, a structured light emitter and/or detector, or any combination thereof. In some embodiments, augmented-reality system 1300 may or may not include sensor 1340 or may include more than one sensor. In embodiments in which sensor 1340 includes an IMU, the IMU may generate calibration data based on measurement signals from sensor 1340. Examples of sensor 1340 may include, without limitation, accelerometers, gyroscopes, magnetometers, other suitable types of sensors that detect motion, sensors used for error correction of the IMU, or some combination thereof.

Augmented-reality system 1300 may also include a microphone array with a plurality of acoustic transducers 1320(A)-1320(J), referred to collectively as acoustic transducers 1320. Acoustic transducers 1320 may be transducers that detect air pressure variations induced by sound waves. Each acoustic transducer 1320 may be configured to detect sound and convert the detected sound into an electronic format (e.g., an analog or digital format). The microphone array in FIG. 13 may include, for example, ten acoustic transducers: 1320(A) and 1320(B), which may be designed to be placed inside a corresponding ear of the user, acoustic transducers 1320(C), 1320(D), 1320(E), 1320(F), 1320(G), and 1320(H), which may be positioned at various locations on frame 1310, and/or acoustic transducers 1320(1) and 1320(J), which may be positioned on a corresponding neckband 1305.

In some embodiments, one or more of acoustic transducers 1320(A)-(F) may be used as output transducers (e.g., speakers). For example, acoustic transducers 1320(A) and/or 1320(B) may be earbuds or any other suitable type of headphone or speaker.

Acoustic transducers 1320(A) and 1320(8) may be positioned on different parts of the user's ear, such as behind the pinna, behind the tragus, and/or within the auricle or fossa. Or, there may be additional acoustic transducers 1320 on or surrounding the ear in addition to acoustic transducers 1320 inside the ear canal. Having an acoustic transducer 1320 positioned next to an ear canal of a user may enable the microphone array to collect information on how sounds arrive at the ear canal. By positioning at least two of acoustic transducers 1320 on either side of a user's head (e.g., as binaural microphones), augmented-reality device 1300 may simulate binaural hearing and capture a 3D stereo sound field around about a user's head. In some embodiments, acoustic transducers 1320(A) and 1320(8) may be connected to augmented-reality system 1300 via a wired con-nection 1330, and in other embodiments acoustic transducers 1320(A) and 1320(8) may be connected to augmented-reality system 1300 via a wireless connection (e.g., a Bluetooth® connection). In still other embodiments, acoustic transducers 1320(A) and 1320(8) may not be used at all in conjunction with augmented-reality system 1300.

Acoustic transducers 1320(A) and 1320(B) may be positioned on different parts of the user's ear, such as behind the pinna, behind the tragus, and/or within the auricle or fossa. Or, there may be additional acoustic transducers 1320 on or surrounding the ear in addition to acoustic transducers 1320 inside the ear canal. Having an acoustic transducer 1320 positioned next to an ear canal of a user may enable the microphone array to collect information on how sounds arrive at the ear canal. By positioning at least two of acoustic transducers 1320 on either side of a user's head (e.g., as binaural microphones), augmented-reality device 1300 may simulate binaural hearing and capture a 3D stereo sound field around about a user's head. In some embodiments, acoustic transducers 1320(A) and 1320(B) may be connected to augmented-reality system 1300 via a wired con-nection 1330, and in other embodiments acoustic transducers 1320(A) and 1320(B) may be connected to augmented-reality system 1300 via a wireless connection (e.g., a Bluetooth connection). In still other embodiments, acoustic transducers 1320(A) and 1320(B) may not be used at all in conjunction with augmented-reality system 1300.

Acoustic transducers 1320 on frame 1310 may be positioned along the length of the temples, across the bridge, above or below display devices 1315(A) and 1315(B), or some combination thereof. Acoustic transducers 1320 may be oriented such that the microphone array is able to detect sounds in a wide range of directions surrounding the user wearing the augmented-reality system 1300. In some embodiments, an optimization process may be performed during manufacturing of augmented-reality system 1300 to determine relative positioning of each acoustic transducer 1320 in the microphone array.

In some examples, augmented-reality system 1300 may include or be connected to an external device (e.g., a paired device), such as neckband 1305. Neckband 1305 generally represents any type or form of paired device. Thus, the following discussion of neckband 1305 may also apply to various other paired devices, such as charging cases, smart watches, smart phones, wrist bands, other wearable devices, hand-held controllers, tablet computers, laptop computers, other external compute devices, etc.

As shown, neckband 1305 may be coupled to eyewear device 1302 via one or more connectors. The connectors may be wired or wireless and may include electrical and/or non-electrical (e.g., structural) components. In some cases, eyewear device 1302 and neckband 1305 may operate independently without any wired or wireless connection between them. While FIG. 13 illustrates the components of eyewear device 1302 and neckband 1305 in example locations on eyewear device 1302 and neckband 1305, the components may be located elsewhere and/or distributed differently on eyewear device 1302 and/or neckband 1305. In some embodiments, the components of eyewear device 1302 and neckband 1305 may be located on one or more additional peripheral devices paired with eyewear device 1302, neckband 1305, or some combination thereof.

Pairing external devices, such as neckband 1305, with augmented-reality eyewear devices may enable the eyewear devices to achieve the form factor of a pair of glasses while still providing sufficient battery and computation power for expanded capabilities. Some or all of the battery power, computational resources, and/or additional features of augmented-reality system 1300 may be provided by a paired device or shared between a paired device and an eyewear device, thus reducing the weight, heat profile, and form factor of the eyewear device overall while still retaining desired functionality. For example, neckband 1305 may allow components that would otherwise be included on an eyewear device to be included in neckband 1305 since users may tolerate a heavier weight load on their shoulders than they would tolerate on their heads. Neckband 1305 may also have a larger surface area over which to diffuse and disperse heat to the ambient environment. Thus, neckband 1305 may allow for greater battery and computation capacity than might otherwise have been possible on a stand-alone eyewear device. Since weight carried in neckband 1305 may be less invasive to a user than weight carried in eyewear device 1302, a user may tolerate wearing a lighter eyewear device and carrying or wearing the paired device for greater lengths of time than a user would tolerate wearing a heavy stand-alone eyewear device, thereby enabling users to more fully incorporate artificial-reality environments into their day-to-day activities.

Neckband 1305 may be communicatively coupled with eyewear device 1302 and/or to other devices. These other devices may provide certain functions (e.g., tracking, localizing, depth mapping, processing, storage, etc.) to augmented-reality system 1300. In the embodiment of FIG. 13, neckband 1305 may include two acoustic transducers (e.g., 1320(1) and 1320(J)) that are part of the microphone array (or potentially form their own microphone subarray). Neckband 1305 may also include a controller 1325 and a power source 1335.

Acoustic transducers 1320(1) and 1320(J) of neckband 1305 may be configured to detect sound and convert the detected sound into an electronic format (analog or digital). In the embodiment of FIG. 13, acoustic transducers 1320(1)

and 1320(J) may be positioned on neckband 1305, thereby increasing the distance between the neckband acoustic transducers 1320(1) and 1320(J) and other acoustic transducers 1320 positioned on eyewear device 1302. In some cases, increasing the distance between acoustic transducers 1320 of the microphone array may improve the accuracy of beamforming performed via the microphone array. For example, if a sound is detected by acoustic transducers 1320(C) and 1320(D) and the distance between acoustic transducers 1320(C) and 1320(D) is greater than, e.g., the distance between acoustic transducers 1320(D) and 1320(E), the determined source location of the detected sound may be more accurate than if the sound had been detected by acoustic transducers 1320(D) and 1320(E).

Controller 1325 of neckband 1305 may process information generated by the sensors on neckband 1305 and/or augmented-reality system 1300. For example, controller 1325 may process information from the microphone array that describes sounds detected by the microphone array. For each detected sound, controller 1325 may perform a direction-of-arrival (DOA) estimation to estimate a direction from which the detected sound arrived at the microphone array. As the microphone array detects sounds, controller 1325 may populate an audio data set with the information. In embodiments in which augmented-reality system 1300 includes an inertial measurement unit, controller 1325 may compute all inertial and spatial calculations from the IMU located on eyewear device 1302. A connector may convey information between augmented-reality system 1300 and neckband 1305 and between augmented-reality system 1300 and controller 1325. The information may be in the form of optical data, electrical data, wireless data, or any other transmittable data form. Moving the processing of information generated by augmented-reality system 1300 to neckband 1305 may reduce weight and heat in eyewear device 1302, making it more comfortable to the user.

Power source 1335 in neckband 1305 may provide power to eyewear device 1302 and/or to neckband 1305. Power source 1335 may include, without limitation, lithium ion batteries, lithium-polymer batteries, primary lithium batteries, alkaline batteries, or any other form of power storage. In some cases, power source 1335 may be a wired power source. Including power source 1335 on neckband 1305 instead of on eyewear device 1302 may help better distribute the weight and heat generated by power source 1335.

As noted, some artificial-reality systems may, instead of blending an artificial reality with actual reality, substantially replace one or more of a user's sensory perceptions of the real world with a virtual experience. One example of this type of system is a head-worn display system, such as virtual-reality system 1400 in FIG. 14, that mostly or completely covers a user's field of view. Virtual-reality system 1400 may include a front rigid body 1402 and a band 1404 shaped to fit around a user's head. Virtual-reality system 1400 may also include output audio transducers 1406(A) and 1406(B). Furthermore, while not shown in FIG. 14, front rigid body 1402 may include one or more electronic elements, including one or more electronic displays, one or more inertial measurement units (IMUS), one or more tracking emitters or detectors, and/or any other suitable device or system for creating an artificial reality experience.

Artificial-reality systems may include a variety of types of visual feedback mechanisms. For example, display devices in augmented-reality system 1300 and/or virtual-reality system 1400 may include one or more liquid crystal displays (LCDs), light emitting diode (LED) displays, organic LED (OLED) displays, digital light project (DLP) micro-displays, liquid crystal on silicon (LCoS) micro-displays, and/or any other suitable type of display screen. Artificial-reality systems may include a single display screen for both eyes or may provide a display screen for each eye, which may allow for additional flexibility for varifocal adjustments or for correcting a user's refractive error. Some artificial-reality systems may also include optical subsystems having one or more lenses (e.g., conventional concave or convex lenses, Fresnel lenses, adjustable liquid lenses, etc.) through which a user may view a display screen. These optical subsystems may serve a variety of purposes, including to collimate (e.g., make an object appear at a greater distance than its physical distance), to magnify (e.g., make an object appear larger than its actual size), and/or to relay (to, e.g., the viewer's eyes) light. These optical subsystems may be used in a non-pupil-forming architecture (such as a single lens configuration that directly collimates light but results in so-called pincushion distortion) and/or a pupil-forming architecture (such as a multi-lens configuration that produces so-called barrel distortion to nullify pincushion distortion).

In addition to or instead of using display screens, some artificial-reality systems may include one or more projection systems. For example, display devices in augmented-reality system 1300 and/or virtual-reality system 1400 may include micro-LED projectors that project light (using, e.g., a waveguide) into display devices, such as clear combiner lenses that allow ambient light to pass through. The display devices may refract the projected light toward a user's pupil and may enable a user to simultaneously view both artificial-reality content and the real world. The display devices may accomplish this using any of a variety of different optical components, including waveguide components (e.g., holographic, planar, diffractive, polarized, and/or reflective waveguide elements), light-manipulation surfaces and elements (such as diffractive, reflective, and refractive elements and gratings), coupling elements, etc. Artificial-reality systems may also be configured with any other suitable type or form of image projection system, such as retinal projectors used in virtual retina displays.

Artificial-reality systems may also include various types of computer vision components and subsystems. For example, augmented-reality system 1300 and/or virtual-reality system 1400 may include one or more optical sensors, such as two-dimensional (2D) or 3D cameras, structured light transmitters and detectors, time-of-flight depth sensors, single-beam or sweeping laser rangefinders, 3D LiDAR sensors, and/or any other suitable type or form of optical sensor. An artificial-reality system may process data from one or more of these sensors to identify a location of a user, to map the real world, to provide a user with context about real-world surroundings, and/or to perform a variety of other functions.

Artificial-reality systems may also include one or more input and/or output audio transducers. In the examples shown in FIG. 14, output audio transducers 1406(A) and 1406(B) may include voice coil speakers, ribbon speakers, electrostatic speakers, piezoelectric speakers, bone conduction transducers, cartilage conduction transducers, tragus-vibration transducers, and/or any other suitable type or form of audio transducer. Similarly, input audio transducers may include condenser microphones, dynamic microphones, ribbon microphones, and/or any other type or form of input transducer. In some embodiments, a single transducer may be used for both audio input and audio output.

While not shown in FIG. 13, artificial-reality systems may include tactile (i.e., haptic) feedback systems, which may be incorporated into headwear, gloves, body suits, handheld controllers, environmental devices (e.g., chairs, floormats, etc.), and/or any other type of device or system. Haptic feedback systems may provide various types of cutaneous feedback, including vibration, force, traction, texture, and/or temperature. Haptic feedback systems may also provide various types of kinesthetic feedback, such as motion and compliance. Haptic feedback may be implemented using motors, piezoelectric actuators, fluidic systems, and/or a variety of other types of feedback mechanisms. Haptic feedback systems may be implemented independent of other artificial-reality devices, within other artificial-reality devices, and/or in conjunction with other artificial-reality devices.

By providing haptic sensations, audible content, and/or visual content, artificial-reality systems may create an entire virtual experience or enhance a user's real-world experience in a variety of contexts and environments. For instance, artificial-reality systems may assist or extend a user's perception, memory, or cognition within a particular environment. Some systems may enhance a user's interactions with other people in the real world or may enable more immersive interactions with other people in a virtual world. Artificial-reality systems may also be used for educational purposes (e.g., for teaching or training in schools, hospitals, government organizations, military organizations, business enterprises, etc.), entertainment purposes (e.g., for playing video games, listening to music, watching video content, etc.), and/or for accessibility purposes (e.g., as hearing aids, visual aids, etc.). The embodiments disclosed herein may enable or enhance a user's artificial-reality experience in one or more of these contexts and environments and/or in other contexts and environments.

The process parameters and sequence of the steps described and/or illustrated herein are given by way of example only and can be varied as desired. For example, while the steps illustrated and/or described herein may be shown or discussed in a particular order, these steps do not necessarily need to be performed in the order illustrated or discussed. The various exemplary methods described and/or illustrated herein may also omit one or more of the steps described or illustrated herein or include additional steps in addition to those disclosed.

The preceding description has been provided to enable others skilled in the art to best utilize various aspects of the exemplary embodiments disclosed herein. This exemplary description is not intended to be exhaustive or to be limited to any precise form disclosed. Many modifications and variations are possible without departing from the spirit and scope of the present disclosure. The embodiments disclosed herein should be considered in all respects illustrative and not restrictive. Reference should be made to the appended claims and their equivalents in determining the scope of the present disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

It will be understood that when an element such as a layer or a region is referred to as being formed on, deposited on, or disposed "on" or "over" another element, it may be located directly on at least a portion of the other element, or one or more intervening elements may also be present. In contrast, when an element is referred to as being "directly on" or "directly over" another element, it may be located on at least a portion of the other element, with no intervening elements present.

As used herein, the term "approximately" in reference to a particular numeric value or range of values may, in certain embodiments, mean and include the stated value as well as all values within 10% of the stated value. Thus, by way of example, reference to the numeric value "50" as "approximately 50" may, in certain embodiments, include values equal to 50±5, i.e., values within the range 45 to 55.

As used herein, the term "substantially" in reference to a given parameter, property, or condition may mean and include to a degree that one of ordinary skill in the art would understand that the given parameter, property, or condition is met with a small degree of variance, such as within acceptable manufacturing tolerances. By way of example, depending on the particular parameter, property, or condition that is substantially met, the parameter, property, or condition may be at least approximately 90% met, at least approximately 95% met, or even at least approximately 99% met.

While various features, elements or steps of particular embodiments may be disclosed using the transitional phrase "comprising," it is to be understood that alternative embodiments, including those that may be described using the transitional phrases "consisting" or "consisting essentially of," are implied. Thus, for example, implied alternative embodiments to a high refractive index and highly birefringent solid organic material that comprises or includes 1,2-diphenylethyne include embodiments where a high refractive index and highly birefringent solid organic material consists of 1,2-diphenylethyne and embodiments where a high refractive index and highly birefringent solid organic material consists essentially of 1,2-diphenylethyne.

What is claimed is:

1. An organic thin film comprising an organic solid crystal material, the organic thin film having mutually orthogonal refractive indices ($n_x$, $n_y$, $n_z$), wherein $n_x$, $n_y$, and $n_z$ each have a value at 589 nm of between approximately 1.5 and approximately 2.6, and $n_x \neq n_y \neq n_z$, wherein the organic solid crystal material comprises an organic molecule selected from the group consisting of 1,2,3-trichlorobenzene, 1,2-diphenylethyne, phenazine, terphenyl, 1,2-bis(4-(methylthio)phenyl)ethyne, and anthracene.

2. The organic thin film of claim 1, wherein the organic solid crystal material comprises a single crystal material or a polycrystalline material.

3. The organic thin film of claim 1, wherein the organic solid crystal material comprises a glassy material having molecules aligned along predetermined directions.

4. The organic thin film of claim 1, wherein $\Delta n_{xy} = \Delta n_{xz} < \Delta n_{yz}$ or $\Delta n_{xy} = \Delta n_{yz} < \Delta n_{xz}$.

5. The organic thin film of claim 1, wherein $n_z$ is at least approximately 1.8 and the organic thin film has an out-of-plane birefringence of at least approximately 0.2.

6. The organic thin film of claim 1, wherein the organic solid crystal material is at least approximately 80% crystalline.

7. The organic thin film of claim 1, wherein a surface of the thin film comprises a profile selected from the group consisting of planar, convex, and concave.

8. An optoelectronic device comprising an organic multilayer thin film, wherein each layer in the organic multilayer thin film comprises the organic thin film of claim 1.

* * * * *